(12) United States Patent
Iwata et al.

(10) Patent No.: US 10,742,905 B2
(45) Date of Patent: Aug. 11, 2020

(54) IMAGING DEVICE AND METHOD OF DRIVING IMAGING DEVICE

(71) Applicant: CANON KABUSHIKI KAISHA, Tokyo (JP)

(72) Inventors: Koichiro Iwata, Kawasaki (JP); Tomoya Kumagai, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/132,164

(22) Filed: Sep. 14, 2018

(65) Prior Publication Data

US 2019/0098231 A1    Mar. 28, 2019

(30) Foreign Application Priority Data

Sep. 22, 2017  (JP) ................................ 2017-182402

(51) Int. Cl.
*H04N 5/341*  (2011.01)
*H04N 5/3745*  (2011.01)
(Continued)

(52) U.S. Cl.
CPC ........... *H04N 5/341* (2013.01); *H01L 27/142* (2013.01); *H01L 27/14609* (2013.01);
(Continued)

(58) Field of Classification Search
None
See application file for complete search history.

(56) References Cited

U.S. PATENT DOCUMENTS

| | | |
|---|---|---|
| 5,532,724 A | 7/1996 | Inagaki |
| 7,741,593 B2 | 6/2010 | Iwata et al. ............... 250/214 R |

(Continued)

FOREIGN PATENT DOCUMENTS

| | | |
|---|---|---|
| JP | 2013-183279 | 9/2013 |
| JP | 2013-211833 | 10/2013 |

(Continued)

OTHER PUBLICATIONS

European Search Report dated Dec. 4, 2018 during prosecution of related European application No. 18195635.0.

(Continued)

*Primary Examiner* — James M Hannett
(74) *Attorney, Agent, or Firm* — Venable LLP

(57) ABSTRACT

An imaging device includes a pixel array unit including a plurality of pixels each including a plurality of photoelectric converters, and a signal processing unit including an analog-digital conversion unit, wherein a part of the pixels outputs a first analog signal based on electric charge generated at N photoelectric converters, and a second analog signal based on electric charge generated at M (M is an integer larger than N) photoelectric converters including the N photoelectric converters, other part of the pixels outputs the second analog signal, the number of the second analog signals output to the signal processing unit is larger than the number of the first analog signals output to the signal processing unit, and the signal processing unit receives the first and the second analog signals from each of the part of the pixels before the analog-digital conversion unit ends analog-digital conversion of the first analog signal.

20 Claims, 16 Drawing Sheets

(51) Int. Cl.
*H04N 5/369* (2011.01)
*H01L 27/142* (2014.01)
*H01L 27/146* (2006.01)
*H03M 1/12* (2006.01)

(52) U.S. Cl.
CPC ............ *H03M 1/12* (2013.01); *H04N 5/3696* (2013.01); *H04N 5/37457* (2013.01)

(56) References Cited

U.S. PATENT DOCUMENTS

| | | | |
|---|---|---|---|
| 8,013,369 B2 | 9/2011 | Iwata et al. .................. 257/290 |
| 8,081,245 B2 | 12/2011 | Itano et al. ................... 348/301 |
| 8,159,577 B2 | 4/2012 | Iwata et al. .................. 348/296 |
| 8,355,066 B2 | 1/2013 | Iwata et al. .................. 348/296 |
| 8,368,790 B2 | 2/2013 | Itano et al. ................... 348/301 |
| 8,415,724 B2 | 4/2013 | Iwata et al. .................. 257/290 |
| 8,598,901 B2 | 12/2013 | Hiyama et al. ............. 324/750.3 |
| 8,670,058 B2 | 3/2014 | Hayashi et al. ............. 348/296 |
| 8,690,310 B1 | 4/2014 | Schmaelzle |
| 8,885,082 B2 | 11/2014 | Noda et al. .................. 348/294 |
| 8,928,786 B2 | 1/2015 | Iwata et al. .................. 348/294 |
| 9,077,921 B2 | 7/2015 | Hashimoto et al. ......................... H04N 5/3745 |
| 9,118,857 B2 | 8/2015 | Lwata et al. ......... H04N 5/3698 |
| 9,154,685 B2 | 10/2015 | Masuyama ........ H04N 5/23212 |
| 9,180,659 B1 | 11/2015 | Condello |
| 9,225,923 B2 | 12/2015 | Hashimoto et al. ... H04N 5/378 |
| 9,432,607 B2 | 8/2016 | Morita et al. .......... H04N 5/378 |
| 9,716,823 B2 | 7/2017 | Iwata et al. ........ H04N 5/23212 |
| 9,831,278 B2 | 11/2017 | Kato et al. ........ H01L 27/14609 |
| 9,979,916 B2 | 5/2018 | Hiyama et al. .... H04N 5/37457 |
| 2013/0127965 A1 | 5/2013 | Kushida et al. |
| 2013/0229555 A1* | 9/2013 | Hashimoto .......... H04N 5/3696 348/300 |
| 2013/0229557 A1 | 9/2013 | Hashimoto |
| 2014/0022354 A1* | 1/2014 | Okigawa ................ H04N 5/347 348/46 |
| 2014/0218424 A1 | 8/2014 | Koitabashi |
| 2014/0368696 A1 | 12/2014 | Uchida |
| 2015/0024648 A1 | 1/2015 | Landa |
| 2015/0092098 A1* | 4/2015 | Konishi ............... H04N 5/2352 348/333.11 |
| 2015/0097906 A1 | 4/2015 | Beier |
| 2015/0156428 A1 | 6/2015 | Uchida |
| 2016/0127669 A1 | 5/2016 | Yamazaki |
| 2018/0006071 A1 | 1/2018 | Kato et al. ............. H04N 5/355 |

FOREIGN PATENT DOCUMENTS

| | | |
|---|---|---|
| JP | 2014-048591 | 3/2014 |
| JP | 2017-69724 | 4/2017 |
| JP | 2017-163539 | 9/2017 |
| WO | 2011/079271 | 6/2011 |

OTHER PUBLICATIONS

Japanese Office Action dated Aug. 29, 2019 during prosecution of related Japanese application No. 2017-182402. (English-language machine translation.)

European Office Action dated Jun. 23, 2020 issued in corresponding European Application No. 18195635.0-1208.

* cited by examiner

IMAGING DEVICE AND METHOD OF DRIVING IMAGING DEVICE

BACKGROUND OF THE INVENTION

Field of the Invention

The present invention relates to an imaging device and a method of driving the imaging device.

Description of the Related Art

An autofocus (AF) function of automatically performing focus (focal point) adjustment at imaging has been widely used in imaging systems such as video cameras and electronic still cameras. In a known imaging device having the AF function, each pixel includes a plurality of photoelectric conversion units. In an imaging device in which one pixel includes two photoelectric conversion units, focal length detection can be performed by a phase difference method using one pair of output signals obtained from the two photoelectric conversion units of one pixel. In addition, the output signals obtained from the two photoelectric conversion units can be added to be used as an image acquisition signal.

Japanese Patent Application Laid-open No. 2013-211833 (hereinafter referred to as Patent Literature 1) discloses a driving method including reading only an image acquisition signal in a row of a pixel array unit and reading a focal length detection signal and an image acquisition signal in a time divisional manner in another row of the pixel array unit.

SUMMARY OF THE INVENTION

According to an aspect of the present invention, there is provided an imaging device including a pixel array unit in which a plurality of pixels each including a plurality of photoelectric converters are disposed at a plurality of rows and a plurality of columns, a plurality of output lines provided for the respective columns and connected with the pixels disposed at the respective columns, and a plurality of column circuits provided for the respective columns and connected with the output lines disposed at the respective columns, wherein each of the plurality of column circuits includes a column signal holding circuit including a first signal holding unit configured to hold an analog signal output from the pixel, and a column analog-digital conversion circuit configured to convert an analog signal output from the column signal holding circuit into a digital signal, wherein each of the plurality of column circuits holds, at the first signal holding unit, a first analog signal based on electric charge generated at N (N is an integer equal to or larger than one) photoelectric converters among the plurality of photoelectric converters of each pixel, and then receives a second analog signal based on electric charge generated at M (M is an integer larger than N and thus equal to or larger than two) photoelectric converters among the plurality of photoelectric converters of the pixel, the M photoelectric converters including the N photoelectric converters before outputting the first analog signal held by the first signal holding unit to the column analog-digital conversion circuit.

According another aspect of the present invention, there is provided an imaging device including a pixel array unit in which a plurality of pixels each including a plurality of photoelectric converters are two-dimensionally disposed, and a signal processing unit including an analog-digital conversion unit configured to convert analog signals output from the plurality of pixels into digital signals, wherein each of a part of the pixels of the plurality of pixels outputs a first analog signal based on electric charge generated at N (N is an integer equal to or larger than one) photoelectric converters among the plurality of photoelectric converters, and a second analog signal based on electric charge generated at M (M is an integer larger than N) photoelectric converters among the plurality of photoelectric converters, the M photoelectric converters including the N photoelectric converters, wherein each of other part of the pixels of the plurality of pixels outputs the second analog signal, wherein the number of the second analog signals output to the signal processing unit is larger than the number of the first analog signals output to the signal processing unit, and wherein the signal processing unit receives the first analog signal and the second analog signal from each of the part of the pixels before the analog-digital conversion unit ends analog-digital conversion of the first analog signal.

According to further another aspect of the present invention, there is provided a method of driving an imaging device including a pixel array unit in which a plurality of pixels each including a first photoelectric converter, a second photoelectric converter, a first transfer transistor connected with the first photoelectric converter, and a second transfer transistor connected with the second photoelectric converter are two-dimensionally disposed, the method including turning on the first transfer transistor at each of a part of pixels of the plurality of pixels to output a first analog signal, turning on the first transfer transistor and the second transfer transistor at each of the part of the pixels to output a second analog signal after the turning on the first transfer transistor step, performing analog-digital conversion of the first analog signal, performing analog-digital conversion of the second analog signal, and turning on the first transfer transistor and the second transfer transistor at each of other part of pixels of the plurality of pixels to output the second analog signal, wherein the number of the second analog signals output from the pixel array unit is larger than the number of the first analog signals output from the pixel array unit, and wherein the turning on the first transfer transistor and the second transfer transistor at each of the part of the pixels to output a second analog signal step is performed before the performing analog-digital conversion of the first analog signal step ends.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

In the driving method disclosed in Patent Literature 1, image quality decreases in some cases due to the difference in the timing of reading an image acquisition signal between a row at which only an image acquisition signal is read and a row at which a focal length detection signal and an image acquisition signal are read.

Embodiments described below relate to the technologies of an imaging device and a method of driving the same that are capable of reducing decrease of image quality is provided when drive is performed to read only an image acquisition signal at a row where a pixel array unit and to read a focal length detection signal and an image acquisition signal at another row where the pixel array.

First Embodiment

Figure 1:
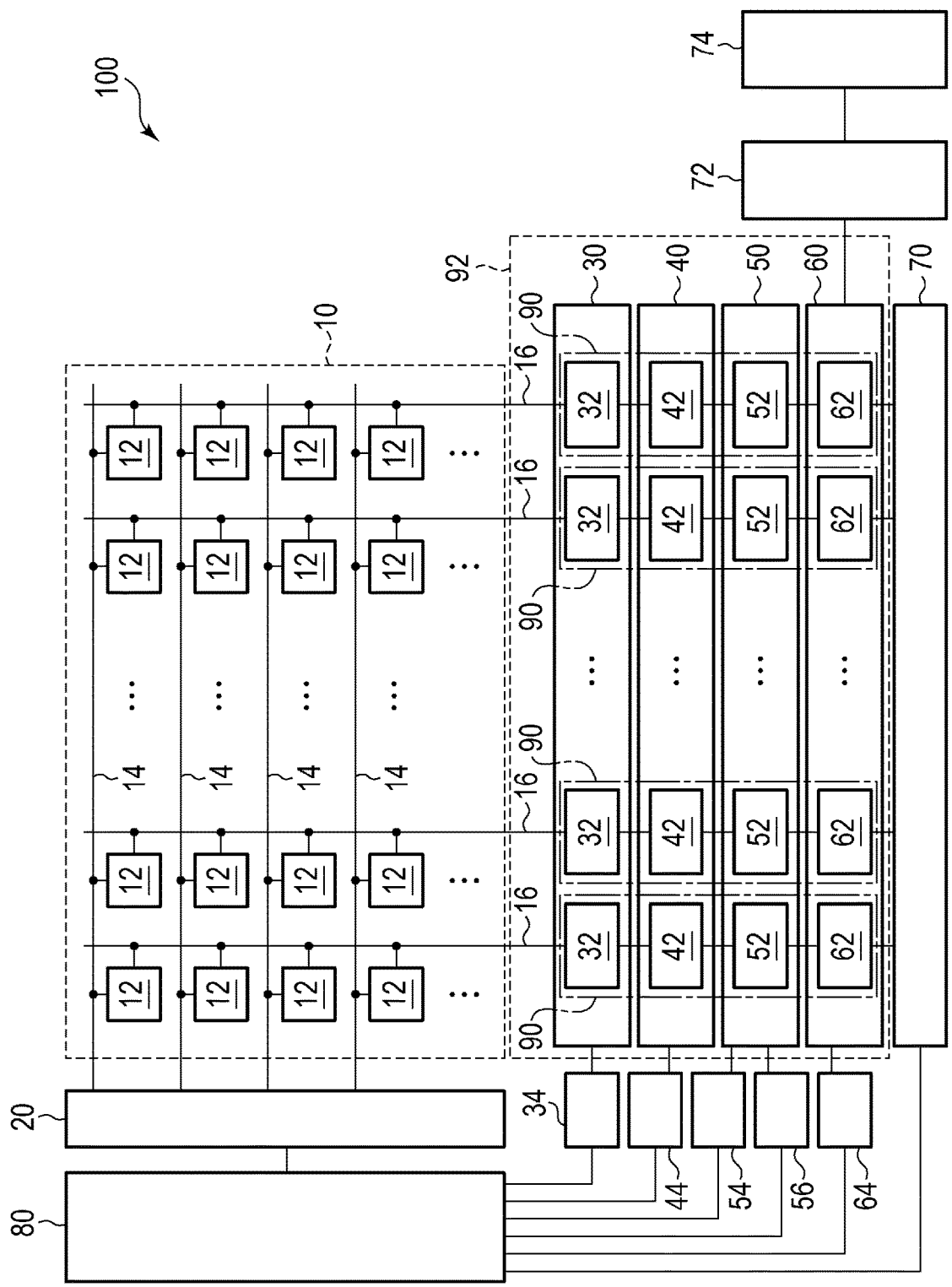
FIG. 1 is a block diagram illustrating a schematic configuration of an imaging device according to a first embodiment of the present invention.
Figure 2:
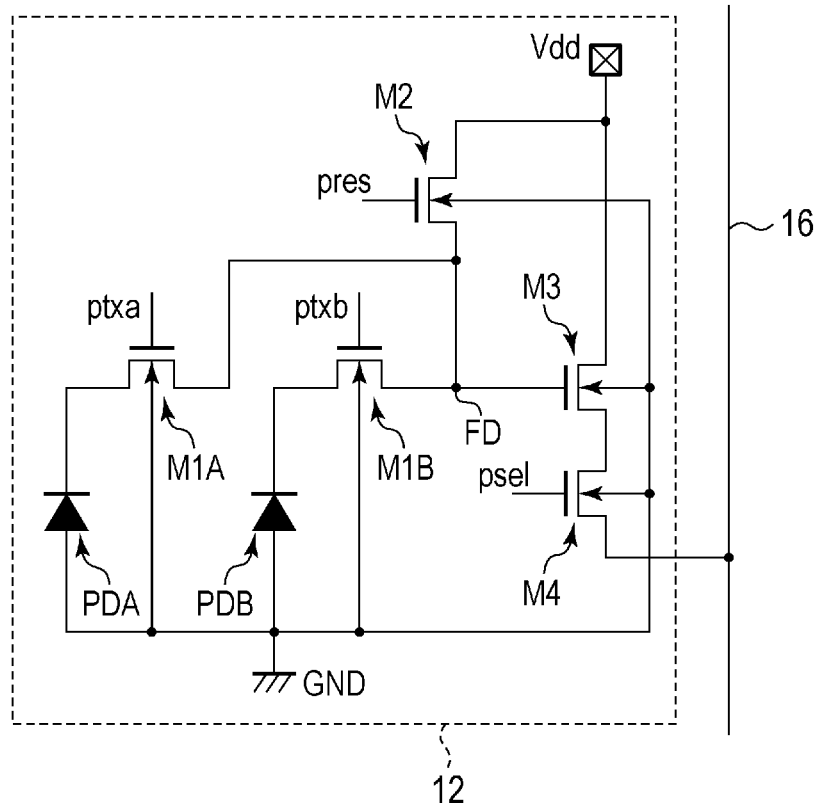
FIG. 2 is a circuit diagram illustrating an exemplary configuration of pixel of the imaging device according to the first embodiment of the present invention.
Figure 3:
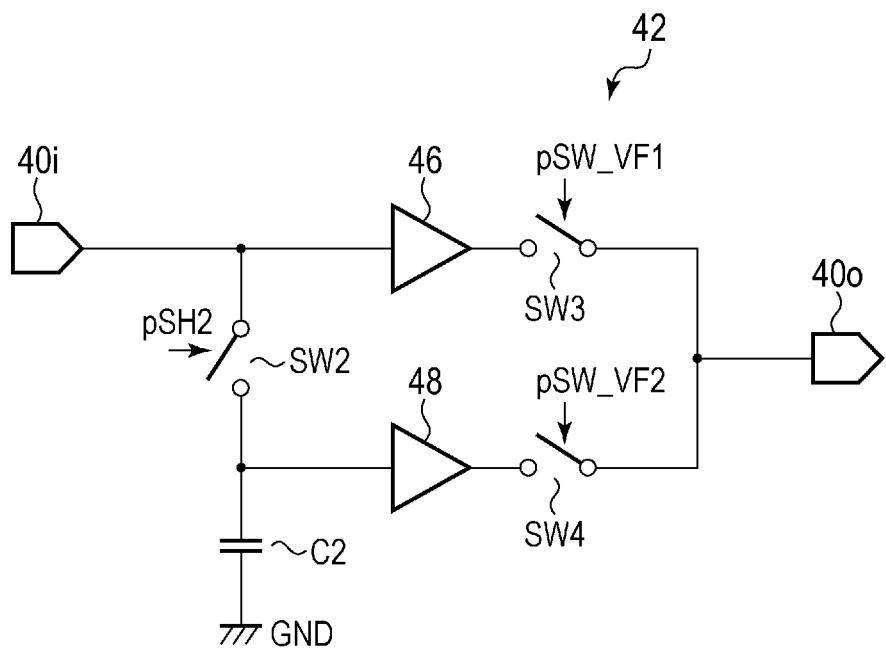
FIG. 3 is a circuit diagram illustrating an exemplary configuration of an analog signal holding unit of the imaging device according to the first embodiment of the present invention.
Figure 4:
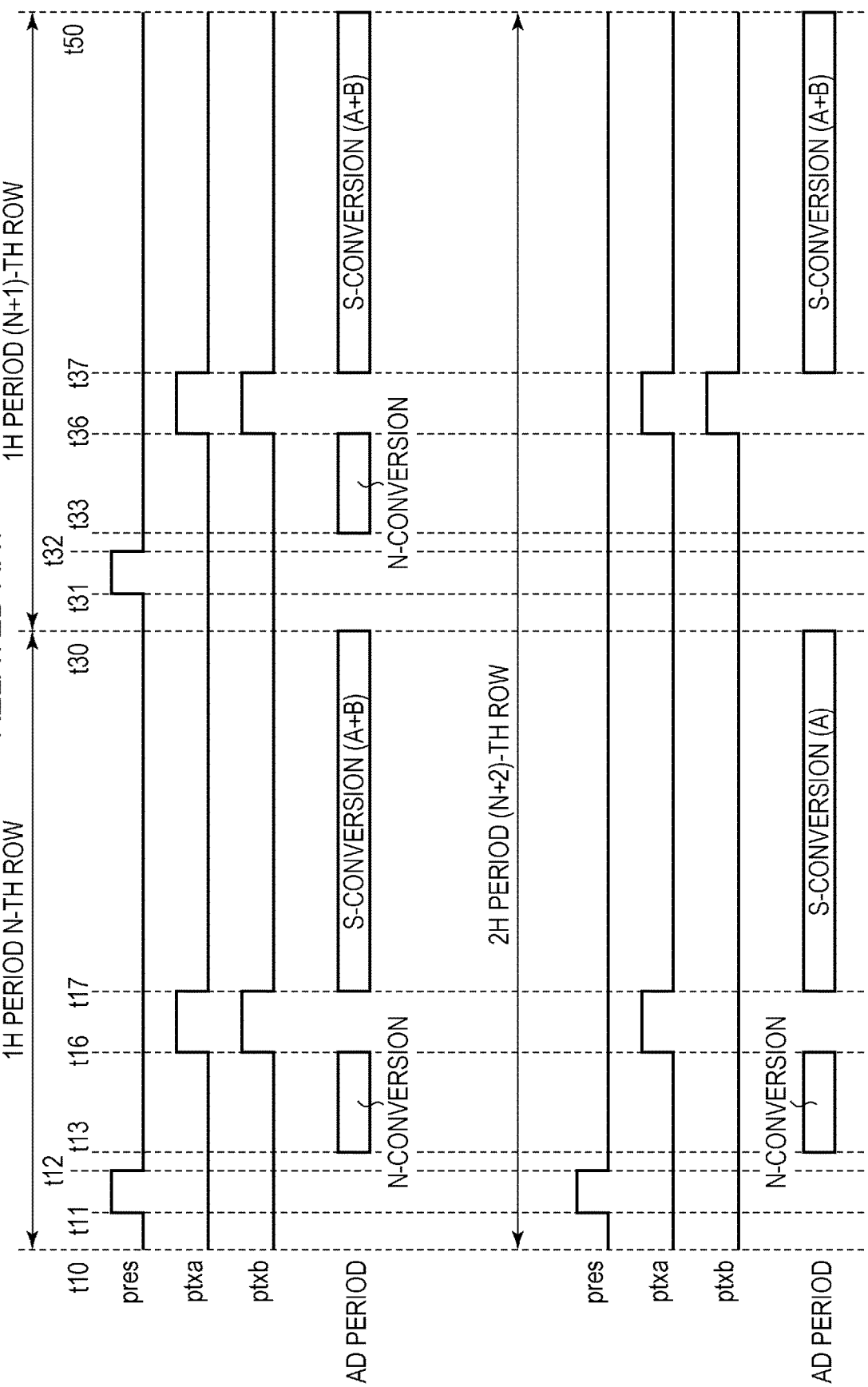
FIG. 4 is a timing chart illustrating a method of driving an imaging device according to a comparative example.
Figure 5:
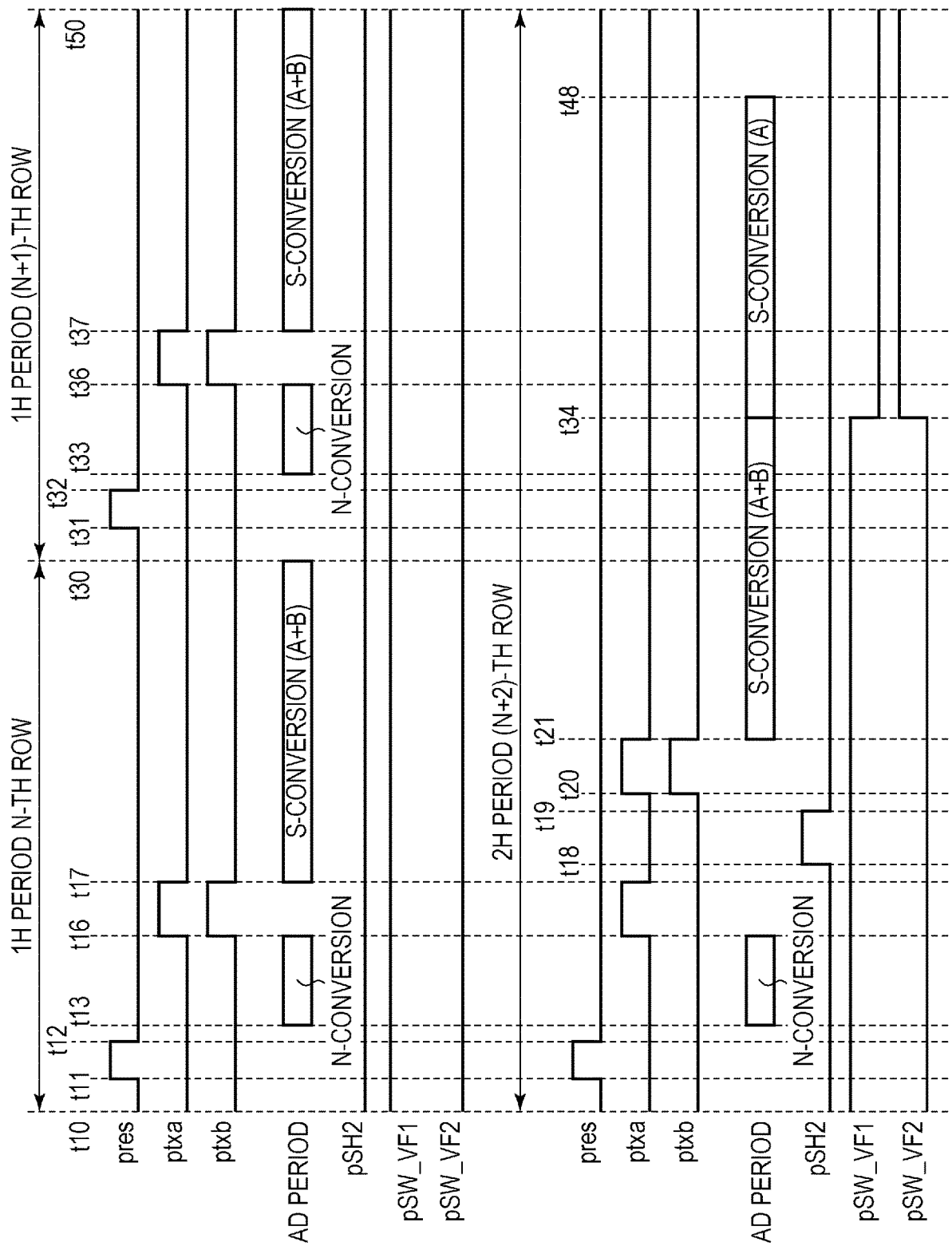
FIG. 5 is a timing chart illustrating a method of driving the imaging device according to the first embodiment of the present invention.

The following describes an imaging device and a method of driving the same according to a first embodiment of the present invention with reference to FIGS. 1 to 5. FIG. 1 is a block diagram illustrating a schematic configuration of the imaging device according to the present embodiment. FIG. 2 is a circuit diagram illustrating an exemplary configuration of pixel of the imaging device according to the present embodiment. FIG. 3 is a circuit diagram illustrating an exemplary configuration of an analog signal holding unit of the imaging device according to the present embodiment. FIG. 4 is a timing chart illustrating a method of driving an imaging device according to a comparative example. FIG. 5 is a timing chart illustrating the method of driving the imaging device according to the present embodiment.

As illustrated in FIG. 1, an imaging device 100 according to the present embodiment includes a pixel array unit 10, a vertical scanning circuit 20, a readout circuit unit 30, an analog signal holding unit 40, an analog-digital (AD) conversion unit 50, a memory unit 60, and a horizontal scanning circuit 70. The imaging device 100 further includes signal generation units 34, 44, and 54, a reference signal generation unit 56, a counter 64, a signal processing circuit (digital front end: DFE) 72, a signal output unit 74, and a timing generator (TG) 80.

The pixel array unit 10 includes a plurality of pixels 12 disposed in a matrix of a plurality of rows and a plurality of columns. FIG. 1 illustrates 16 pixels 12 arrayed in 4×4 among the pixels 12 included in the pixel array unit 10, but the number of the pixels 12 included in the pixel array unit 10 is not particularly limited.

A control line 14 extending in a first direction (in FIG. 1, the lateral direction) is disposed at each row of the pixel array unit 10. The control line 14 is connected with each of the pixels 12 arranged in the first direction, and functions as a signal line common to the pixels 12. In the present specification, the first direction in which the control line 14 extends is also referred to as a row direction.

An output line 16 extending in a second direction (in FIG. 1, the longitudinal direction) intersecting with the first direction is disposed at each column of the pixel array unit 10. The output line 16 is connected with each of the pixels 12 arranged in the second direction, and functions as a signal line common to the pixels 12. In the present specification, the second direction in which the output line 16 extends is also referred to as a column direction.

The control line 14 of each row is connected with the vertical scanning circuit 20. The vertical scanning circuit 20 is a circuit unit configured to supply, when a pixel signal is to be read out from each pixel 12, a control signal for driving a readout circuit in the pixel 12 to the pixel 12 through the control line 14. The output line 16 of each column has one end connected with a signal processing unit 92. In the present embodiment, the signal processing unit 92 includes at least an analog-digital conversion unit 50. The signal processing unit 92 may further include the readout circuit unit 30, the analog signal holding unit 40, and the memory unit 60. In FIG. 1, the one end of the output line 16 of each column is connected with the readout circuit unit 30.

The readout circuit unit 30 includes a plurality of column readout circuits 32 corresponding to the respective columns of the pixel array unit 10. The column readout circuit 32 of each column includes a current source load (not illustrated) for reading signals from the pixels 12. The column readout circuit 32 may further include a column amplifier (not illustrated) configured to amplify a pixel signal. The readout circuit unit 30 is connected with a signal generation unit 34. The signal generation unit 34 includes a pulse generation unit configured to generate a pulse signal for controlling the column readout circuit 32 of each column, and a reference bias circuit unit configured to control, for example, current flowing to the column amplifier. The readout circuit unit 30 is connected with the analog signal holding unit 40.

The analog signal holding unit 40 includes a plurality of column signal holding circuits 42 corresponding to the respective columns of the pixel array unit 10. The column signal holding circuit 42 of each column includes a signal holding unit configured to temporarily hold pixel signals read out from the pixels 12 through the output line 16 and the column readout circuit 32. The analog signal holding unit 40 is connected with a signal generation unit 44. The signal generation unit 44 includes a pulse generation unit configured to generate a pulse signal for controlling the column signal holding circuit 42 of each column. The analog signal holding unit 40 is connected with the AD conversion unit 50.

The AD conversion unit 50 converts a pixel signal held by the column signal holding circuit 42 of each column of the analog signal holding unit 40 from an analog signal (hereinafter also referred to as "analog pixel signal") into a digital signal (hereinafter also referred to as "digital pixel signal"). The AD conversion unit 50 includes a plurality of column analog-digital conversion circuits (hereinafter referred to as "column AD conversion circuits") 52 corresponding to the respective columns of the pixel array unit 10 and each including a comparator (not illustrated). The AD conversion unit 50 is connected with a signal generation unit 54 and the reference signal generation unit 56. The signal generation unit 54 includes a pulse generation unit configured to generate a pulse signal for controlling the column AD conversion circuit 52 of each column, and a reference bias circuit unit configured to control, for example, current flowing to the comparator. The reference signal generation unit 56 is a circuit unit configured to generate a reference signal (for example, a lamp signal) to be compared with a pixel signal. The AD conversion unit 50 is connected with the memory unit 60.

The memory unit 60 includes a plurality of column memories 62 corresponding to the respective columns of the pixel array unit 10. The memory unit 60 is connected with the counter 64. The counter performs a count operation and outputs a count value to the memory unit 60. The column memory 62 of each column stores, as the digital value (digital pixel signal) of a pixel signal, the count value at a timing when a latch signal is output from the comparator of each column of the AD conversion unit 50. The memory unit 60 is connected with the horizontal scanning circuit 70 and a signal processing circuit 72.

The horizontal scanning circuit 70 is a circuit unit configured to supply the memory unit 60 with a control signal for outputting the digital pixel signal stored in the column memory 62 of each column of the memory unit 60 to the signal processing circuit 72. The signal processing circuit 72 performs signal processing such as correlated double sampling (CDS) on the digital pixel signal received from the memory unit 60. The signal processing circuit 72 is connected with the signal output unit 74. The signal output unit 74 includes an external interface of low voltage differential signaling (LVDS) or the like, and outputs the digital pixel signal processed by the signal processing circuit 72 externally from the imaging device 100.

In the present specification, the column readout circuit 32, the column signal holding circuit 42, the column AD conversion circuit 52, and the column memory 62 disposed at each column are also collectively referred to as a column circuit 90 of the column.

The timing generator 80 is a control unit for supplying the vertical scanning circuit 20, the signal generation units 34, 44, and 54, the reference signal generation unit 56, the counter 64, the horizontal scanning circuit 70, and the like with control signals for controlling operations thereof and the timings of the operations. At least part of these control signals may be supplied from the outside of the imaging device 100.

FIG. 2 is a circuit diagram illustrating an exemplary configuration of each pixel 12. Each of the plurality of pixels 12 includes photoelectric converters PDA and PDB, transfer transistors M1A and M1B, a reset transistor M2, an amplifier transistor M3, and a select transistor M4.

The photoelectric converters PDA and PDB are, for example, photodiodes. The photoelectric converters PDA and PDB of each pixel 12 share one microlens (not illustrated), and each of the photoelectric converters PDA and PDB are configured to receive light passed through different pupil areas of the exit pupil of a lens. With this configuration, a signal based on electric charge generated at the photoelectric converter PDA and a signal based on electric charge generated at the photoelectric converter PDB can be used as focal length detection signals. A signal based on total electric charge as the sum of the electric charge generated at the photoelectric converter PDA and the electric charge generated at the photoelectric converter PDB can be used as an image acquisition signal.

The photoelectric converter PDA has an anode connected with a ground node (GND), and a cathode connected with the source of the transfer transistor M1A. The photoelectric converter PDB has an anode connected with the ground node (GND), and a cathode connected with the source of the transfer transistor M1B. The drains of the transfer transistors M1A and M1B are connected with the source of the reset transistor M2 and the gate of the amplifier transistor M3. The drains of the transfer transistors M1A and M1B and the source of the reset transistor M2 and the gate of the amplifier transistor M3 are connected with each other at what is called a floating diffusion FD. The floating diffusion FD includes a capacitor component, functions as an electric charge holding unit, and serves as a charge-voltage conversion unit made of the capacitor component. The drain of the reset transistor M2 and the drain of the amplifier transistor M3 are connected with a power source node (voltage Vdd). The source of the amplifier transistor M3 is connected with the drain of the select transistor M4. The source of the select transistor M4 is connected with the output line 16. The source and drain of a transistor may be named differently in accordance with the conductivity type of the transistor, a function of interest, and the like, and are also called by names opposite to those in the above description.

In the circuit configuration illustrated in FIG. 2, the control line 14 of each row includes a first transfer gate signal line, a second transfer gate signal line, a reset signal line, and a select signal line (all not illustrated). The first transfer gate signal line is connected with the gate of the transfer transistor M1A of each pixel 12 belonging to the corresponding row, and supplies the gate of the transfer transistor M1A with a control signal ptxa output from the vertical scanning circuit 20. The second transfer gate signal line is connected with the gate of the transfer transistor M1B of each pixel 12 belonging to the corresponding row, and supplies the gate of the transfer transistor M1B with a control signal ptxb output from the vertical scanning circuit 20. The reset signal line is connected with the gate of the reset transistor M2 of each pixel 12 belonging to the corresponding row, and supplies the gate of the reset transistor M2 with a control signal pres output from the vertical scanning circuit 20. The select signal line is connected with the gate of the select transistor M4 of each pixel 12 belonging to the corresponding row, and supplies the gate of the select transistor M4 with a control signal psel output from the vertical scanning circuit 20. When each transistor of the pixel 12 is an n-channel transistor, the transistor turns on upon supply of a corresponding high-level control signal from the vertical scanning circuit 20, or turns off upon supply of a low-level control signal from the vertical scanning circuit 20.

FIG. 3 is a circuit diagram illustrating the column signal holding circuit 42 of each column included in the analog signal holding unit 40. As illustrated in FIG. 3, each column signal holding circuit 42 includes an input node 40i, switches SW2, SW3, and SW4, a signal holding unit C2, buffer amplifiers 46 and 48, and an output node 40o.

The input node 40i is connected with the output line 16 of the corresponding column through the column readout circuit 32 of the corresponding column of the readout circuit unit 30. In other words, the input node 40i directly receives a pixel signal output from the pixel 12 through the output line 16 in accordance with the configuration of the column readout circuit 32, or receives a pixel signal amplified by the column amplifier of the column readout circuit 32. The output node 40o is connected with the comparator of the column AD conversion circuit 52 of the corresponding column of the AD conversion unit 50.

The input node 40i is connected with an input terminal of the buffer amplifier 46. The input node 40i is connected with an input terminal of the buffer amplifier 48 and one terminal of the signal holding unit C2 through the switch SW2. The other terminal of the signal holding unit C2 is connected with the ground node (GND). The signal holding unit C2 is, for example, a capacitor element. An output terminal of the buffer amplifier 46 is connected with the output node 40o through the switch SW3. An output terminal of the buffer amplifier 48 is connected with the output node 40o through the switch SW4.

The switch SW2 is a switch for holding a signal input from the input node 40i at the signal holding unit C2. The buffer amplifier 46 is a buffer amplifier for outputting, from the output node 40o, the signal input from the input node 40i. The buffer amplifier 48 is a buffer amplifier for outputting the signal held by the signal holding unit C2 from the output node 40o. When the switch SW3 is turned on, the signal input from the input node 40i is output from the output node 40o through the buffer amplifier 46. When the switch SW4 is turned on, the signal held by the signal holding unit C2 is output from the output node 40o through the buffer amplifier 48.

The switches SW2, SW3, and SW4 are switches, the connection states of which are controlled by control signals pSH2, pSW_VF1, and pSW_VF2, respectively. In the present embodiment, each switch becomes the conduction state when the corresponding control signal is at high level, or becomes the non-conduction state when the corresponding control signal is at low level. However, the relation between the connection state of the switch and the signal level of the control signal may be opposite to that in the present embodiment.

The following describes a basic operation of each component of the imaging device according to the present embodiment with reference to FIGS. 1 to 3.

When an optical image of an object is incident on the pixel array unit 10, the photoelectric converters PDA and PDB of each pixel 12 convert the incident light into electric charge in an amount in accordance with the light quantity thereof (optical-electrical conversion), and accumulates the generated electric charge. When turned on, the transfer transistors M1A and M1B transfer the electric charge at the photoelectric converters PDA and PDB to the floating diffusion FD. The floating diffusion FD becomes at a voltage in accordance with the amount of the electric charge transferred from the photoelectric converters PDA and PDB through charge-voltage conversion by the capacitor component thereof. The amplifier transistor M3 is supplied with the voltage Vdd at the drain, and supplied, at the source, with bias current from the current source of the column readout circuit 32 through the select transistor M4, and functions as an amplification unit (source follower circuit) including an input node at the gate. With this configuration, the amplifier transistor M3 outputs a signal based on the voltage of the floating diffusion FD to the output line 16 through the select transistor M4. When turned on, the reset transistor M2 resets the floating diffusion FD to a voltage in accordance with the voltage Vdd.

The transfer transistors M1A and M1B, the reset transistor M2, and the select transistor M4 of the pixel 12 are controlled in units of rows by the control signals ptxa, ptxb, pres, and psel supplied from the vertical scanning circuit 20. Pixel signals of a plurality of pixels 12 belonging to a row (selected row) selected by the control signal psel are simultaneously output to the output line 16 of each column.

Each pixel signal output to the output line 16 of each column is input to the analog signal holding unit 40 through the readout circuit unit 30 and held by the column signal holding circuit 42 of the corresponding column. The pixel signal held by the column signal holding circuit 42 of each column is input to one input terminal of the comparator of the column AD conversion circuit 52 of the corresponding column of the AD conversion unit 50. The reference signal supplied from the reference signal generation unit 56 is input to the other input terminal of the comparator. The reference signal is a signal such as a lamp signal, the voltage of which changes in accordance with time elapse. The comparator of the column AD conversion circuit 52 of each column compares the signal level of the pixel signal held by the column signal holding circuit 42 against the signal level of the reference signal, and outputs a latch signal to the memory unit 60 when the magnitude relation of these signal levels is inverted.

The counter 64 counts the number of pulses of a clock signal generated by the timing generator 80, and outputs the count value to the memory unit 60. The memory unit 60 stores, as the digital value (digital pixel signal) of the pixel signal in the column memory 62 of each column, the count value corresponding to a time until the comparator outputs the latch signal after the reference signal starts changing.

The horizontal scanning circuit 70 sequentially outputs a control signal to the column memory of each column of the memory unit 60 under control of the timing generator 80. Having received the control signal from the horizontal scanning circuit 70, the memory unit 60 outputs the digital pixel signal stored in the column memory 62 of the corresponding column to the signal processing circuit 72. The signal processing circuit 72 performs predetermined signal processing such as digital CDS on the digital pixel signal received from the memory unit 60. The signal output unit 74 externally outputs, through the external interface, the digital pixel signal processed by the signal processing circuit 72.

Before description of the method of driving the imaging device according to the present embodiment, the following describes a method of driving an imaging device according to the comparative example with reference to FIG. 4. In this description, in the imaging device according to the comparative example, the column signal holding circuit 42 of each column of the analog signal holding unit 40 includes only one buffer amplifier. This corresponds to the column signal holding circuit 42 including the buffer amplifier 46 but not including the buffer amplifier 48, the switches SW2 and SW4, and the signal holding unit C2 in FIG. 3.

FIG. 4 is a timing chart illustrating the method of driving the imaging device according to the comparative example. The following description is made on an operation of reading pixel signals of the pixels 12 belonging to three rows of the N-th row, the (N+1)-th row, and the (N+2)-th row among the plurality of rows of the pixel array unit 10 in the stated order. The N-th row and the (N+1)-th row are rows (hereinafter referred to as "image signal acquisition rows") at which image acquisition signals are acquired, and the (N+2)-th row is a row (hereinafter referred to as a "focal length detection signal acquisition row") at which a focal length detection signal and an image acquisition signal are acquired.

To facilitate understanding of the relation between operation periods of an image signal acquisition row and an focal length detection signal acquisition row, FIG. 4 illustrates, at upper and lower parts, reading operations at the N-th row and the (N+1)-th row and a reading operation at the (N+2)-th row on the same time axis. In reality, the reading operation at the (N+2)-th row is performed after the reading operation at the N-th row and the (N+1)-th row. Time t50 in the reading operation at the N-th row and the (N+1)-th row corresponds to time t10 in the reading operation at the (N+2)-th row.

FIG. 4 illustrates the control signals pres, ptxa, and ptxb and a period ("AD period" in FIG. 4) in which AD conversion is performed. In FIG. 4, "N conversion" indicates the AD conversion period of an N signal, "S conversion (A+B)" indicates the AD conversion period of the S signal (A+B signal), and "S conversion (A)" indicates the AD conversion period of the S signal (A signal). The N signal is a pixel signal (noise signal) when the floating diffusion FD is at a reset level. The S signal is a pixel signal (optical signal) when the floating diffusion FD is at a predetermined voltage in accordance with the amount of signal electric electric charge generated at the photoelectric converters PDA and PDB. The "A+B signal" is a pixel signal based on electric electric charge generated at both the photoelectric converters PDA and PDB. The "A signal" is a pixel signal based on electric electric charge generated at the photoelectric converter PDA.

Although FIG. 4 does not illustrate the control signal psel, the select signal line of a row (selected row) at which a reading operation is performed is supplied with the control signal psel at high level, and the select signal line of any other row (non-selected row) is supplied with the control signal psel at low level. At a row at which a reading operation is performed, the select transistor M4 of each pixel 12 belonging to this row is turned on by the control signal psel at high level and becomes ready to output a pixel signal to the output line 16. The control signals psel, pres, ptxa, and ptxb of a row at which a reading operation is not performed are held at low level. The control signals psel, pres, ptxa, and ptxb are supplied from the vertical scanning circuit 20 under control of the timing generator 80.

The above description related to the timing chart is same for timing charts used in description of embodiments to be described later.

In the timing chart at the upper part of FIG. 4, the period from time t10 to time t30 corresponds to one horizontal period (1H period), and the reading operation at the pixels 12 belonging to the N-th row is performed in the 1H period.

At time t10, the control signals pres, ptxa, and ptxb are at low level. In the subsequent period from time t11 to time t12, the control signal pres of the N-th row is controlled to become high level to turn on the reset transistor M2 of each pixel 12 belonging to the N-th row. Accordingly, the floating diffusion FD of each pixel 12 belonging to the N-th row is reset to a voltage at a reset level in accordance with the voltage Vdd. Hereinafter, this operation is referred to as "FD reset". A pixel signal (N signal) in accordance with the reset voltage of the floating diffusion FD is output from each pixel 12 belonging to the N-th row to the output line 16 of each column.

Then, in the period from time t13 to time t16, the N signals output from the pixels 12 of each column of the N-th row are performed to AD conversion (N conversion) at the column AD conversion circuit 52 of each column of the AD conversion unit 50.

Then, in the period from time t16 to time t17, the control signals ptxa and ptxb of the N-th row are controlled to become high level to turn on the transfer transistors M1A and M1B of each pixel 12 belonging to the N-th row. Accordingly, signal electric charge accumulated at the photoelectric converters PDA and PDB of each pixel 12 belonging to the N-th row is transferred to the floating diffusion FD. Then, the floating diffusion FD of each pixel 12 belonging to the N-th row becomes at a voltage in accordance with the amount of the signal electric charge transferred from the photoelectric converters PDA and PDB. Each pixel 12 belonging to the N-th row outputs, to the output line 16 of each column, a pixel signal (S signal) in accordance with the amount of the signal electric charge generated at the photoelectric converters PDA and PDB. This pixel signal is a signal (A+B signal) obtained by adding a pixel signal (A signal) based on signal electric charge generated at the photoelectric converter PDA and a pixel signal (B signal) based on signal electric charge generated at the photoelectric converter PDB, and can be used as an image acquisition signal.

Then, in the period from time t17 to time t30, the S signals (A+B signal) output from the pixels 12 of each column of the N-th row are performed to AD conversion (S conversion (A+B)) at the column AD conversion circuit 52 of each column of the AD conversion unit 50.

In the timing chart at the upper part of FIG. 4, the period from time t30 to time t50 corresponds to one horizontal period, and the reading operation of each pixel 12 belonging to the (N+1)-th row is performed in the 1H period. The reading operation of the (N+1)-th row is performed in a similar manner at a timing same as that of the reading operation of the N-th row except that the start time thereof shifts from time t10 to time t30, and thus specific description thereof will be omitted below.

In the timing chart at the lower part of FIG. 4, the period from time t10 to time t50 corresponds to the reading period of the pixels 12 belonging to the (N+2)-th row. The reading operation at the (N+2)-th row is performed in two horizontal periods (2H period).

At time t10, the control signals pres, ptxa, and ptxb are at low level. In the subsequent period from time t11 to time t12, the control signal pres of the (N+2)-th row is controlled to become high level to turn on the reset transistor M2 of each pixel 12 belonging to the (N+2)-th row. Accordingly, the FD reset of the pixels 12 belonging to the (N+2)-th row is performed. A pixel signal (N signal) in accordance with the reset voltage of the floating diffusion FD is output from each pixel 12 belonging to the (N+2)-th row to the output line 16 of each column.

Then, in the period from time t13 to time t16, the N signals output from the pixels 12 of each column of the (N+2)-th row are performed to AD conversion (N conversion) at the column AD conversion circuit 52 of each column of the AD conversion unit 50.

Then, in the period from time t16 to time t17, the control signal ptxa of the (N+2)-th row is controlled to become high level to turn on the transfer transistor M1A of each pixel 12 belonging to the (N+2)-th row. Accordingly, signal electric charge accumulated at the photoelectric converter PDA of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converter PDA. A pixel signal (S signal) in accordance with signal electric charge generated at the photoelectric converter PDA is output from each pixel 12 belonging to the (N+2)-th row to the output line 16 of each column. This pixel signal is a pixel signal (A signal) based on the signal electric charge generated at the photoelectric converter PDA, and can be used as a focal length detection signal. The B signal, which is used as a focal length detection signal together with the A signal, can be obtained by subtracting the A signal from the A+B signal.

Then, in the period from time t17 to time t30, the S signals (A signals) output from the pixels 12 of each column of the (N+2)-th row are performed to AD conversion (S conversion (A)) at the column AD conversion circuit 52 of each column of the AD conversion unit 50.

Then, in the period from time t36 to time t37, the control signals ptxa and ptxb of the (N+2)-th row are controlled to become high level to turn on the transfer transistors M1A and M1B of each pixel 12 belonging to the (N+2)-th row. Accordingly, signal electric charge accumulated at the photoelectric converters PDA and PDB of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converters PDA and PDB. A pixel signal (S signal) in accordance with the amount of the signal electric charge generated at the photoelectric converters PDA and PDB is output from each pixel 12 belonging to the (N+2)-th row to the output line 16 of each column. This pixel signal is a signal (A+B signal) obtained by adding a pixel signal (A signal) based on signal electric charge generated at the photoelectric converter PDA and a pixel signal (B signal) based on signal electric charge generated at the photoelectric converter PDB, and can be used as an image acquisition signal.

Then, in the period from time t37 to time t50, the S signals (A+B signals) output from the pixels 12 of each column of the (N+2)-th row are performed to AD conversion (S conversion (A+B)) at the column AD conversion circuit 52 of each column of the AD conversion unit 50.

In this manner, only reading of the image acquisition signal (A+B signal) is performed at the image signal acquisition rows (the N-th row and the (N+1)-th row) by using the single floating diffusion FD. However, reading of the focal length detection signal (A signal) and reading of the image acquisition signal (A+B signal) are subsequently performed at the focal length detection signal acquisition row (the (N+2)-th row) by using the single floating diffusion FD. Accordingly, in the above-described method of driving the imaging device according to the comparative example, the length of a period from the FD reset to the end of the S conversion (A+B) is largely different between an image signal acquisition row and a focal length detection signal acquisition row.

Specifically, the period from the FD reset to the end of the S conversion (A+B) at an image signal acquisition row corresponds to the period from time t12 to time t30 (or the period from time t32 to time t50). However, the period from the FD reset to the end of the S conversion (A+B) at a focal length detection signal acquisition row corresponds to the period from time t12 to time t50. The period from time t12 to time t30 is common to the image signal acquisition row and the focal length detection signal acquisition row. The period from time t30 to time t50 corresponds to 1H period. Accordingly, the period from the FD reset to the end of the S conversion (A+B) is longer for the focal length detection signal acquisition row than for the image signal acquisition row by a time corresponding to 1H period. The 1H period is not particularly limited, but is, for example, 10 μsec approximately.

The period from the FD reset to the end of the S conversion (A+B) overlaps with a period in which the floating diffusion FD is in a floating state. Accordingly, influence of leakage current of the floating diffusion FD and dark current generated at the floating diffusion FD on the signal level of an image acquisition signal is large at the focal length detection signal acquisition row as compared to the image signal acquisition row. As a result, an output difference is generated between an image acquisition signal acquired from the image signal acquisition row and an image acquisition signal acquired from the focal length detection signal acquisition row, also when control is performed so that the accumulation time of signal electric charge for an image acquisition signal is same between the rows. Then, when one image is formed by using these image acquisition signals, the output difference between the image signal acquisition row and the focal length detection signal acquisition row appears as degradation of image quality.

To avoid this, in the imaging device according to the present embodiment, the analog signal holding unit 40 is configured as the column signal holding circuit 42 illustrated in FIG. 3, and the reading operation of a focal length detection signal acquisition row is executed in accordance with a timing chart illustrated in FIG. 5.

FIG. 5 illustrates the control signals pSH2, pSW_VF1, and pSW_VF2 in addition to the control signals pres, ptxa, and ptxb and the AD period that are same as those in FIG. 4. The control signals pSH2, pSW_VF1, and pSW_VF2 are control signals for controlling the connection states of the switches SW2, SW3, and SW4, respectively. The control signals pSH2, pSW_VF1, and pSW_VF2 are supplied from the signal generation unit 44 under control of the timing generator 80.

As illustrated in the timing chart at the upper part of FIG. 5, the reading operation at the N-th row and the (N+1)-th row is same as that in the method of driving the imaging device according to the comparative example illustrated in FIG. 4. In other words, in the reading operation at the N-th row and the (N+1)-th row, the control signals pSH2 and pSW_VF2 are controlled to become low level and the control signal pSW_VF1 is controlled to become high level to turn on the switch SW3 and turn off the switches SW2 and SW4. Accordingly, a pixel signal input to the input node 40i is output from the output node 40o through the buffer amplifier 46 and the switch SW3 and performed to AD conversion at the column AD conversion circuit 52 of the AD conversion unit 50.

In the timing chart illustrated at the lower part of FIG. 5, the period from time t10 to time t48 corresponds to the reading period of the pixels 12 belonging to the (N+2)-th row.

At time t10, the control signals pres, ptxa, ptxb, pSH2, and pSW_VF2 are at low level, and the control signal pSW_VF1 is at high level. The initial connection state of the column signal holding circuit 42 is same as that in the reading operation at the N-th row and the (N+1)-th row.

In the subsequent period from time t11 to time t12, the control signal pres of the (N+2)-th row is controlled to become high level to turn on the reset transistor M2 of each pixel 12 belonging to the (N+2)-th row. Accordingly, the FD reset of the pixels 12 belonging to the (N+2)-th row is performed. A pixel signal (N signal) in accordance with the reset voltage of the floating diffusion FD is output from each pixel 12 belonging to the (N+2)-th row to the output line 16 of each column. In this state, since the switch SW3 is on, a pixel signal (N signal) input to the input node 40i of the column signal holding circuit 42 from the output line 16 of each column through the column readout circuit 32 is output from the output node 40o through the buffer amplifier 46 and the switch SW3.

Then, in the period from time t13 to time t16, the N signal output from the column signal holding circuit 42 of each column of the (N+2)-th row is performed to AD conversion (N conversion) at the column AD conversion circuit 52 of each column of the AD conversion unit 50.

Then, in the period from time t16 to time t17, the control signal ptxa of the (N+2)-th row is controlled to become high level to turn on the transfer transistor M1A of each pixel 12 belonging to the (N+2)-th row. Accordingly, signal electric charge accumulated at the photoelectric converter PDA of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converter PDA. A pixel signal (A signal) in accordance with the amount of the signal electric charge generated at the photoelectric converter PDA is output from each pixel 12 belonging to the (N+2)-th row to the output line 16 of each column.

Then, in the period from time t18 to time t19 after the control signal ptxa of the (N+2)-th row is controlled to become low level, the control signal pSH2 is controlled to become high level to turn on the switch SW2. Accordingly, the input node 40i of the column signal holding circuit 42 of each column and the signal holding unit C2 are connected with each other through the switch SW2 so that the A signal input from the input node 40i is held by the signal holding unit C2.

Then, in the period from time t20 to time t21 after the control signal pSH2 is controlled to become low level, the control signals ptxa and ptxb of the (N+2)-th row are controlled to become high level to turn on the transfer transistors M1A and M1B of each pixel 12 belonging to the (N+2)-th row. Accordingly, signal electric charge accumulated at the photoelectric converters PDA and PDB of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converters PDA and PDB. A pixel signal (S signal) in accordance with the amount of the signal electric charge generated at the photoelectric converters PDA and PDB is output from each pixel 12 belonging to the (N+2)-th row to the output line 16 of each column. This pixel signal is a signal (A+B signal) obtained by adding a pixel signal (A signal) based on signal electric charge generated at the photoelectric converter PDA and a pixel signal (B signal) based on signal electric charge generated at the photoelectric converter PDB.

A pixel signal (A+B signal) input to the input node 40i of the column signal holding circuit 42 from the output line 16 of each column through the column readout circuit 32 is output from the output node 40o through the buffer amplifier 46 and the switch SW3.

Then, in the period from time t21 to time t34 after the control signals ptxa and ptxb of the (N+2)-th row are controlled to become low level, the A+B signal output from the column signal holding circuit 42 of each column is performed to AD conversion (S conversion (A+B)) at the column AD conversion circuit 52 of each column of the AD conversion unit 50. In this manner, in the driving method according to the present embodiment, the image acquisition signal (A+B signal) is provided with AD conversion before the focal length detection signal (A signal) sampled and held at the signal holding unit C2 in the period from time t18 to time t19.

Then, at time t34 after the period of the S conversion (A+B) ends, the control signal pSW_VF1 is controlled to become low level from high level, and the control signal pSW_VF2 is controlled to become high level from low level. The control signal pSH2 remains at low level. Accordingly, the switches SW2 and SW3 are turned off, and the switch SW4 is turned on to output A signal held by the signal holding unit C2 from the output node 40o through the buffer amplifier 48 and the switch SW4.

Then, in the period from time t34 to time t48, the A signal output from the column signal holding circuit 42 of each column is performed to AD conversion (S conversion (A)) at the column AD conversion circuit 52 of each column of the AD conversion unit 50.

When the operation is performed in this manner, the period from the FD reset to the end of the S conversion (A+B) at a focal length detection signal acquisition row can be reduced to the period from time t12 to time t34 from the period from time t12 to time t50 in the comparative example. Accordingly, variation in the signal level of an image acquisition signal due to leakage current of the floating diffusion FD and dark current generated at the floating diffusion FD can be reduced at a focal length detection signal acquisition row.

The period from time t30 to time t34 is a period exceeding the period from the FD reset to the end of the S conversion (A+B) at an image signal acquisition row in the period from the FD reset to the end of the S conversion (A+B) at a focal length detection signal acquisition row. As indicated by the comparison between the operation of the N-th row and the operation of the (N+2)-th row in FIG. 5, the period from time t30 to time t34 has a length same as that of the period from time t17 to time t21. The period from time t17 to time t21 is a period in which the sampling and holding of an A signal and the transferring of signal electric charge to the floating diffusion FD are performed, and is 1 μsec to 3 μsec approximately.

Thus, when the driving method according to the present embodiment is applied, the difference in the period from the FD reset to the end of the S conversion (A+B) between an image signal acquisition row and a focal length detection signal acquisition row can be reduced from 10 μsec approximately, which is obtained in the comparative example, to 1 µsec to 3 µsec approximately. Accordingly, the difference between the change amount of the signal level of an image acquisition signal acquired from the image signal acquisition row and the change amount of the signal level of an image acquisition signal acquired from the focal length detection signal acquisition row can be reduced to ⅓ or smaller, thereby improving the image quality.

In this manner, according to the present embodiment, decrease of the image quality attributable to the difference in the timing of reading an image acquisition signal between a row at which only an image acquisition signal is read and a row at which a focal length detection signal and an image acquisition signal are read can be reduced. The row at which only an image acquisition signal is read and the row at which a focal length detection signal and an image acquisition signal are read may change for each frame. The period from start of vertical scanning of pixels at a plurality of rows by the vertical scanning circuit 20 to the next vertical scanning of these pixels at the plurality of rows is a frame period in which a pixel signal corresponding to one frame is generated. Typically, this period is a period until a vertical synchronizing signal with which the TG 80 instructs the vertical scanning circuit 20 to start vertical scanning becomes active level again for the next time after the vertical synchronizing signal becomes active level.

Second Embodiment

Figure 6:
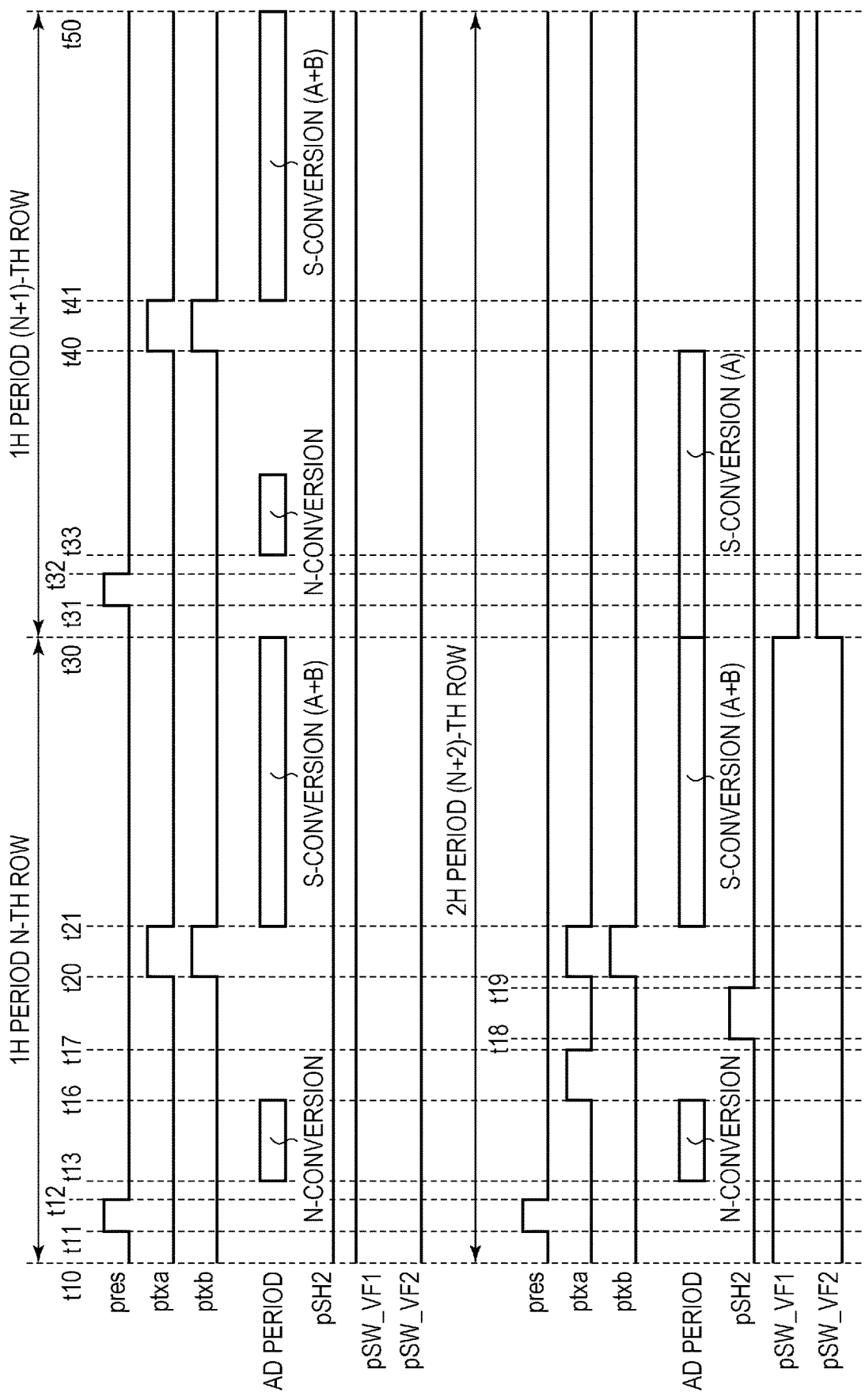
FIG. 6 is a timing chart illustrating a method of driving an imaging device according to a second embodiment of the present invention.

The following describes a method of driving an imaging device according to a second embodiment of the present invention with reference to FIG. 6. Any component identical to that of the imaging device according to the first embodiment is denoted by an identical reference sign, and description thereof will be omitted or simplified. The driving method described in the present embodiment is another method of driving the imaging device according to the first embodiment.

FIG. 6 is a timing chart illustrating the method of driving the imaging device according to the present embodiment. Similarly to FIG. 5, FIG. 6 illustrates the control signals pres, ptxa, ptxb, pSH2, pSW_VF1, and pSW_VF2 and the AD period in the reading operations at the N-th row, the (N+1)-th row, and the (N+2)-th row.

In the driving method according to the present embodiment, the timing of transferring signal electric charge to the floating diffusion FD at an image signal acquisition row is retarded so that the period from the FD reset to the end of the S conversion (A+B) is equal between an image signal acquisition row and a focal length detection signal acquisition row. Any other operation is same as that of the imaging device according to the first embodiment illustrated in FIG. 5.

Specifically, at an image signal acquisition row (the N-th row), signal electric charge is transferred from the photoelectric converters PDA and PDB to the floating diffusion FD in the period from time t16 to time t17 in the first embodiment. However, in the present embodiment, signal electric charge is transferred from the photoelectric converters PDA and PDB to the floating diffusion FD in the period from time t20 to time t21, for which the timing from the FD reset is same as that of a focal length detection signal acquisition row.

Specifically, in the reading operation of the N-th row, in the period from time t20 to time t21, the control signals ptxa and ptxb of the N-th row are controlled to become high level to turn on the transfer transistors M1A and M1B of each pixel 12 belonging to the N-th row. Accordingly, signal electric charge accumulated at the photoelectric converters PDA and PDB of each pixel 12 belonging to the N-th row is transferred to the floating diffusion FD. Then, the floating diffusion FD of each pixel 12 belonging to the N-th row becomes at a voltage in accordance with the amount of the signal electric charge transferred from the photoelectric converters PDA and PDB. A pixel signal (A+B signal) in accordance with the amount of the signal electric charge generated at the photoelectric converters PDA and PDB is output from each pixel 12 belonging to the N-th row to the output line 16 of each column. The subsequent period from time t21 to time t30 is a period in which the A+B signal output from each pixel 12 of the N-th row is performed to AD conversion (S conversion (A+B)).

Similarly, in the reading operation of the (N+1)-th row, in the period from time t40 to time t41, the control signals ptxa and ptxb of the (N+1)-th row are controlled to become high level to turn on the transfer transistors M1A and M1B of each pixel 12 belonging to the (N+1)-th row. Accordingly, signal electric charge accumulated at the photoelectric converters PDA and PDB of each pixel 12 belonging to the (N+1)-th row is transferred to the floating diffusion FD. Then, the floating diffusion FD of each pixel 12 belonging to the (N+1)-th row becomes at a voltage in accordance with the amount of the signal electric charge transferred from the photoelectric converters PDA and PDB. A pixel signal (A+B signal) in accordance with the amount of the signal electric charge generated at the photoelectric converters PDA and PDB is output from the pixels 12 belonging to the (N+1)-th row to the output line 16 of each column. The subsequent period from time t41 to time t50 is a period in which the A+B signal output from each pixel 12 of the (N+1)-th row is performed to AD conversion (S conversion (A+B)).

Accordingly, the period in which the A+B signal output from each pixel 12 in the reading operation at the (N+2)-th row is performed to AD conversion (S conversion (A+B)) ends at time t30, which is a timing same as the end of the 1H period in which the reading operation of the N-th row is performed. In the reading operation at the (N+2)-th row, time t30 is also the timing at which the control signal pSW_VF1 is controlled to become low level from high level and the control signal pSW_VF2 is controlled to become high level from low level. In the reading operation at the (N+2)-th row, the A signal output from each pixel 12 is performed to AD conversion (S conversion (A)) in the period from time t30 to time t40.

When the operation is performed in this manner, the period from the FD reset to the end of the S conversion (A+B) at an image signal acquisition row is equal to the period from the FD reset to the end of the S conversion (A+B) at a focal length detection signal acquisition row. Accordingly, the change amount of the signal level is equivalent between an image acquisition signal acquired from the image signal acquisition row and an image acquisition signal acquired from the focal length detection signal acquisition row, thereby reducing decrease of the image quality.

In the driving method according to the present embodiment, the timing of transferring signal electric charge to the floating diffusion FD is retarded at the image signal acquisition row, and accordingly, the 1H period is longer by a time (3 µsec approximately) corresponding to the period from time t17 to time t21. As a result, the maximum frame rate is slightly lower than that of the driving method according to the first embodiment, which is not particularly a problem within the range of specifications of the imaging device.

In this manner, according to the present embodiment, decrease of the image quality attributable to the difference in the timing of reading an image acquisition signal between a row at which only an image acquisition signal is read and a row at which a focal length detection signal and an image acquisition signal are read can be reduced.

Third Embodiment

Figure 7:
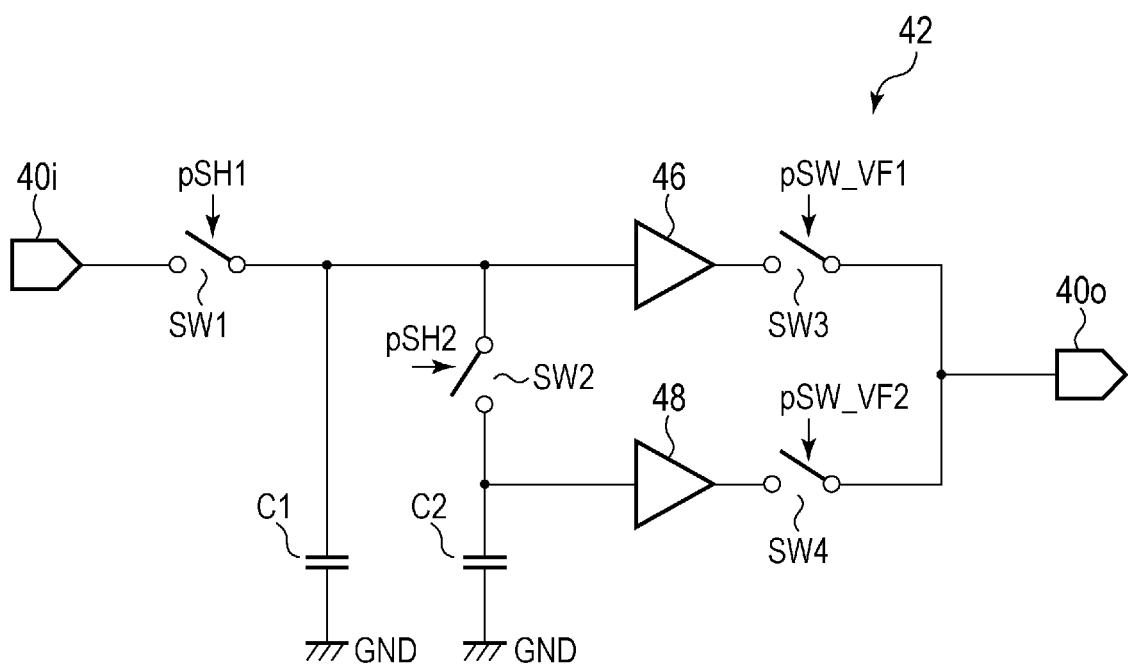
FIG. 7 is a circuit diagram illustrating an exemplary configuration of an analog signal holding unit of an imaging device according to a third embodiment of the present invention.
Figure 8:
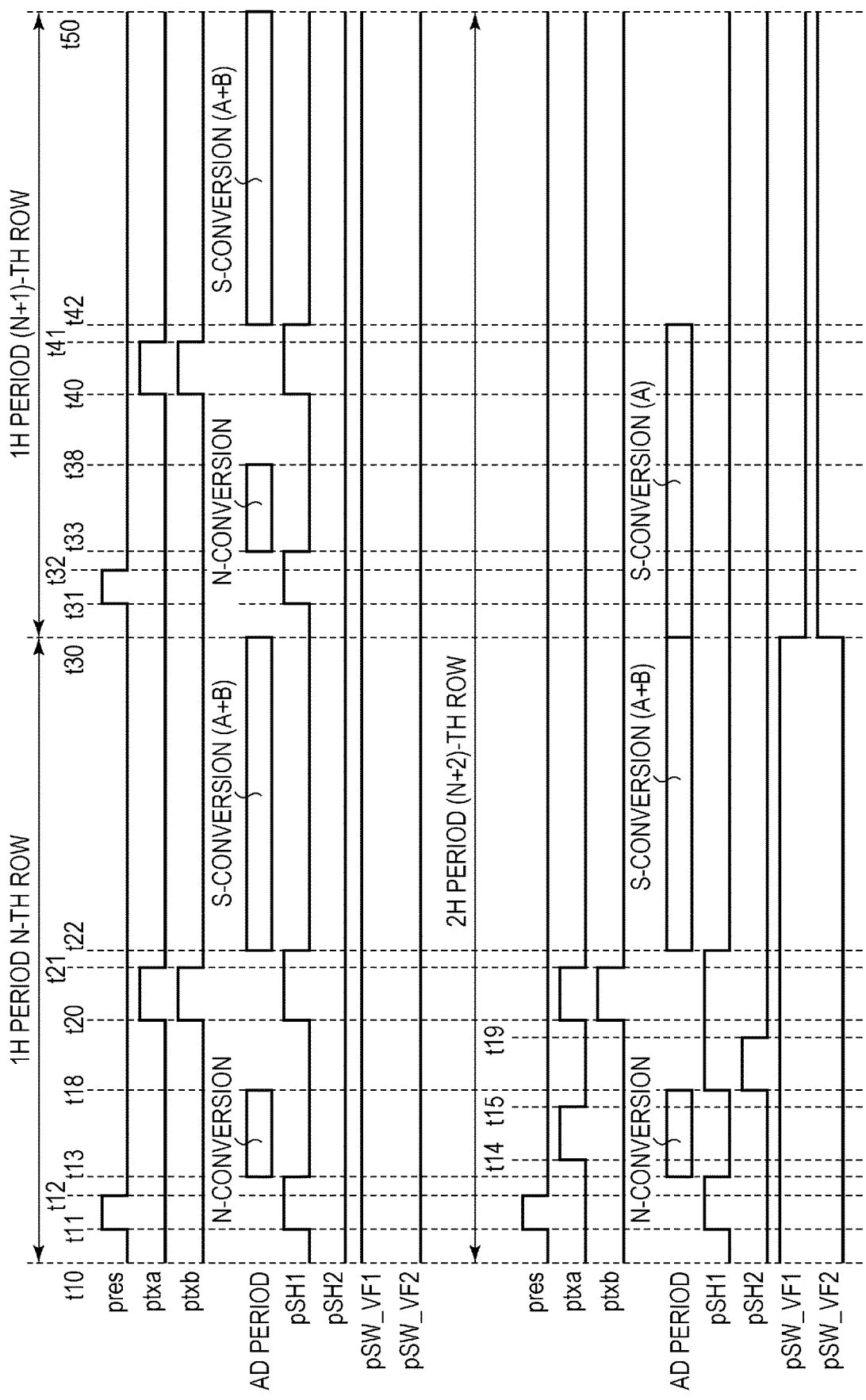
FIG. 8 is a timing chart illustrating a method of driving the imaging device according to the third embodiment of the present invention.

The following describes an imaging device and a method of driving the same according to a third embodiment of the present invention with reference to FIGS. 7 and 8. Any component identical to those of the imaging devices according to the first and second embodiments is denoted by an identical reference sign, and description thereof will be omitted or simplified. FIG. 7 is a circuit diagram illustrating an exemplary configuration of the analog signal holding unit of the imaging device according to the present embodiment. FIG. 8 is a timing chart illustrating the method of driving the imaging device according to the present embodiment.

The imaging device according to the present embodiment is same as the imaging device according to the first embodiment except that the column signal holding circuit 42 of each column included in the analog signal holding unit 40 has a different circuit configuration.

As illustrated in FIG. 7, the column signal holding circuit 42 of the imaging device according to the present embodiment includes the input node 40i, the switches SW1, SW2, SW3, and SW4, the signal holding units C1 and C2, the buffer amplifiers 46 and 48, and the output node 40o. The input node 40i is connected with the input terminal of the buffer amplifier 46 and one terminal of the signal holding unit C1 through the switch SW1. The input node 40i is also connected with the input terminal of the buffer amplifier 48 and one terminal of the signal holding unit C2 through the switches SW1 and SW2. The other terminals of the signal holding units C1 and C2 are connected with the ground node (GND). The signal holding units C1 and C2 are, for example, capacitor elements. The output terminal of the buffer amplifier 46 is connected with the output node 40o through the switch SW3. The output terminal of the buffer amplifier 48 is connected with the output node 40o through the switch SW4.

The switches SW1 and SW2 are used to select the signal holding units C1 and C2 for holding a signal input from the input node 40i. When the switch SW1 is turned on and the switch SW2 is turned off, the signal input from the input node 40i is held by the signal holding unit C1. When the switches SW1 and SW2 are turned on, the signal input from the input node 40i is held by the signal holding unit C2. The connection state of the switch SW1 is controlled by the control signal pSH1. The buffer amplifiers 46 and 48 are buffer amplifiers for outputting, from the output node 40o, the signals held by the signal holding units C1 and C2. The switches SW3 and SW4 are switches for selecting a signal to be output from the output node 40o from among the signals held by the signal holding units C1 and C2. When the switch SW3 is turned on, the signal held by the signal holding unit C1 is output from the output node 40o. When the switch SW4 is turned on, the signal held by the signal holding unit C2 is output from the output node 40o.

The following describes the method of driving the imaging device according to the present embodiment with reference to FIG. 8. In the driving method according to the present embodiment, similarly to the first and second embodiments, the S conversion (A) is performed after the S conversion (A+B) is performed.

FIG. 8 is a timing chart illustrating the method of driving the imaging device according to the present embodiment. FIG. 8 illustrates the control signal pSH1 in addition to the control signals pres, ptxa, ptxb, pSH2, pSW_VF1, and pSW_VF2 and the AD period that are same as those in FIG. 5. The control signal pSH1 is a control signal for controlling the connection state of the switch SW1. Similarly to the control signals pSH2, pSW_VF1, and pSW_VF2, the control signal pSH1 is supplied from the signal generation unit 44 under control of the timing generator 80.

In the timing chart at the upper part of FIG. 8, the period from time t10 to time t30 corresponds to one horizontal period (1H period), and the reading operation of the pixels 12 belonging to the N-th row is performed in the 1H period.

At time t10, the control signals pres, ptxa, ptxb, pSH1, pSH2, and pSW_VF2 are at low level, and the control signal pSW_VF1 is at high level.

In the subsequent period from time t11 to time t12, the control signal pres of the N-th row is controlled to become high level to turn on the reset transistor M2 of each pixel 12 belonging to the N-th row. Accordingly, the FD reset of each pixel 12 belonging to the N-th row is performed. A pixel signal (N signal) in accordance with the reset voltage of the floating diffusion FD is output from each pixel 12 belonging to the N-th row to the output line 16 of each column.

In the period from time t11 to time t13, the control signal pSH1 is controlled to become high level to turn on the switch SW1. Accordingly, the input node 40i of the column signal holding circuit 42 of each column and the signal holding unit C1 are connected with each other through the switch SW1 so that the pixel signal (N signal) output from the pixel 12 is held by the signal holding unit C1 through the switch SW1. In this state, since the switch SW3 is on, the N signal held by the signal holding unit C1 is output from the output node 40o through the buffer amplifier 46 and the switch SW3.

Then, in the period from time t13 to time t18 after the switch SW1 is turned off, the N signal output from the column signal holding circuit 42 of each column is performed to AD conversion (N conversion) at the column AD conversion circuit 52 of each column of the AD conversion unit 50.

Then, in the period from time t20 to time t21, the control signals ptxa and ptxb of the N-th row are controlled to become high level to turn on the transfer transistors M1A and M1B of each pixel 12 belonging to the N-th row. Accordingly, signal electric electric charge accumulated at the photoelectric converters PDA and PDB of each pixel 12 belonging to the N-th row is transferred to the floating diffusion FD. Then, the floating diffusion FD of each pixel 12 belonging to the N-th row becomes at a voltage in accordance with the amount of the signal electric charge transferred from the photoelectric converters PDA and PDB. A pixel signal (A+B signal) in accordance with the amount of the signal electric charge generated at the photoelectric converters PDA and PDB is output from each pixel 12 belonging to the N-th row to the output line 16 of each column.

In the period from time t20 to time t22, the control signal pSH1 is controlled to become high level to turn on the switch SW1. Accordingly, the input node 40i of the column signal holding circuit 42 of each column and the signal holding unit C1 are connected with each other through the switch SW1 so that the pixel signal (A+B signal) output from the pixel 12 is held by the signal holding unit C1 through the switch SW1. In this state, since the switch SW3 is on, the A+B signal held by the signal holding unit C1 is output from the output node 40o through the buffer amplifier 46 and the switch SW3.

Then, in the period from time t22 to time t30 after the switch SW1 is turned off, the A+B signal output from the column signal holding circuit 42 of each column is performed to AD conversion (S conversion (A+B)) at the column AD conversion circuit 52 of each column of the AD conversion unit 50.

In the timing chart at the upper part of FIG. 8, the period from time t30 to time t50 corresponds to one horizontal period, and the reading operation of each pixel 12 belonging to the (N+1)-th row is performed in the 1H period, similarly to the N-th row. The reading operation of the (N+1)-th row is performed in a similar manner at a timing same as that of the reading operation of the N-th row except that the start time thereof shifts from time t10 to time t30, and thus specific description thereof will be omitted below.

In the timing chart illustrated at the lower part of FIG. 8, the period from time t10 to time t42 corresponds to the reading period of the pixels 12 belonging to the (N+2)-th row.

At time t10, the control signals pres, ptxa, ptxb, pSH1, pSH2, and pSW_VF2 are at low level, and the control signal pSW_VF1 is at high level. The initial connection state of the column signal holding circuit 42 is same as that in the reading operation at the N-th row and the (N+1)-th row.

In the subsequent period from time t11 to time t12, the control signal pres of the (N+2)-th row is controlled to become high level to turn on the reset transistor M2 of each pixel 12 belonging to the (N+2)-th row. Accordingly, the FD reset of the pixels 12 belonging to the (N+2)-th row is performed. A pixel signal (N signal) in accordance with the reset voltage of the floating diffusion FD is output from each pixel 12 belonging to the (N+2)-th row to the output line 16 of each column.

In the period from time t11 to time t13, the control signal pSH1 is controlled to become high level to turn on the switch SW1. Accordingly, the input node 40i of the column signal holding circuit 42 of each column and the signal holding unit C1 are connected with each other through the switch SW1 so that the pixel signal (N signal) output from the pixel 12 is held by the signal holding unit C1 through the switch SW1. In this state, since the switch SW3 is on, the N signal held by the signal holding unit C1 is output from the output node 40o through the buffer amplifier 46 and the switch SW3.

Then, in the period from time t13 to time t18 after the switch SW1 is turned off, the N signal output from the column signal holding circuit 42 of each column is performed to AD conversion (N conversion) at the column AD conversion circuit 52 of each column of the AD conversion unit 50.

In the period from time t14 to time t15 overlapping with the period of the N conversion, the control signal ptxa of the (N+2)-th row is controlled to become high level to turn on the transfer transistor M1A of each pixel 12 belonging to the (N+2)-th row. Accordingly, signal electric charge accumulated at the photoelectric converter PDA of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converter PDA. A pixel signal (A signal) in accordance with the amount of the signal electric charge generated at the photoelectric converter PDA is output from each pixel 12 belonging to the (N+2)-th row to the output line 16 of each column.

In the period of the N conversion, the switch SW1 is off, and the column signal holding circuit 42 of each column is cut off from the readout circuit unit 30. Thus, the transferring of signal electric charge from the photoelectric converter PDA to the floating diffusion FD can be performed in a period overlapping with the period of the N conversion. Accordingly, the 1H period can be reduced.

Then, at time t18 after the N conversion ends, the control signal pSH1 is controlled to become high level from low level to turn on the switch SW1.

In the period from time t18 to time t19, the control signal pSH2 is controlled to become high level to turn on the switch SW2. Accordingly, the input node 40i of the column signal holding circuit 42 of each column and the signal holding unit C2 are connected with each other through the switches SW1 and SW2 so that the pixel signal (A signal) output from the pixels 12 is held by the signal holding unit C2 through the switches SW1 and SW2.

Then, in the period from time t20 to time t21 after the switch SW2 is turned off, the control signals ptxa and ptxb of the (N+2)-th row are controlled to become high level to turn on the transfer transistors M1A and M1B of each pixel 12 belonging to the (N+2)-th row. Accordingly, signal electric charge accumulated at the photoelectric converters PDA and PDB of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converters PDA and PDB. A pixel signal (A+B signal) in accordance with the amount of the signal electric charge generated at the photoelectric converters PDA and PDB is output from each pixel 12 belonging to the (N+2)-th row to the output line 16 of each column. In this state, since the switch SW1 is on, the A+B signal output from the pixel 12 is held by the signal holding unit C1 through the switch SW1. Also, in this state, since the switch SW3 is on, the A+B signal held by the signal holding unit C1 is output from the output node 40o through the buffer amplifier 46 and the switch SW3.

Then, at time t22 after the control signals ptxa and ptxb of the (N+2)-th row are controlled to become low level, the control signal pSH1 is controlled to become low level from high level to turn off the switch SW1.

Then, in the period from time t22 to time t30 after the switch SW1 is turned off, the A+B signal output from the column signal holding circuit 42 of each column is performed to AD conversion (S conversion (A+B)) at the column AD conversion circuit 52 of each column of the AD conversion unit 50.

Then, at time t30 after the period of the S conversion (A+B) ends, the control signal pSW_VF1 is controlled to become low level from high level, and the control signal pSW_VF2 is controlled to become high level from low level. Accordingly, the switches SW1, SW2, and SW3 are turned off and the switch SW4 is turned on so that a signal held by the signal holding unit C2 is output from the output node 40o through the buffer amplifier 48 and the switch SW4.

Then, in the period from time t30 to time t42, the A signal output from the column signal holding circuit 42 of each column is performed to AD conversion (S conversion (A)) at the column AD conversion circuit 52 of each column of the AD conversion unit 50.

In the above-described driving method according to the present embodiment, the period until the A+B signal is held by the signal holding unit C1 after the FD reset is equal between an image signal acquisition row and a focal length detection signal acquisition row. Accordingly, the change amount of the signal level is equivalent between an image acquisition signal acquired from the image signal acquisition row and an image acquisition signal acquired from the focal length detection signal acquisition row, thereby reducing decrease of the image quality.

In addition, since the N conversion and the electric charge transferring from the photoelectric converter PDA to the floating diffusion FD are performed in overlapping periods, the 1H period is reduced. The 1H period is longer than that in the first embodiment only by a time taken for holding the A signal in the signal holding unit C2. The time taken for the holding is 1 μsec or shorter, and thus the 1H period is reduced by 2 μsec approximately as compared to that in the driving method according to the second embodiment, thereby reducing decrease of the frame rate.

In this manner, according to the present embodiment, decrease of the image quality attributable to the difference in the timing of reading an image acquisition signal between a row at which only an image acquisition signal is read and a row at which a focal length detection signal and an image acquisition signal are read can be reduced.

Fourth Embodiment

Figure 9:
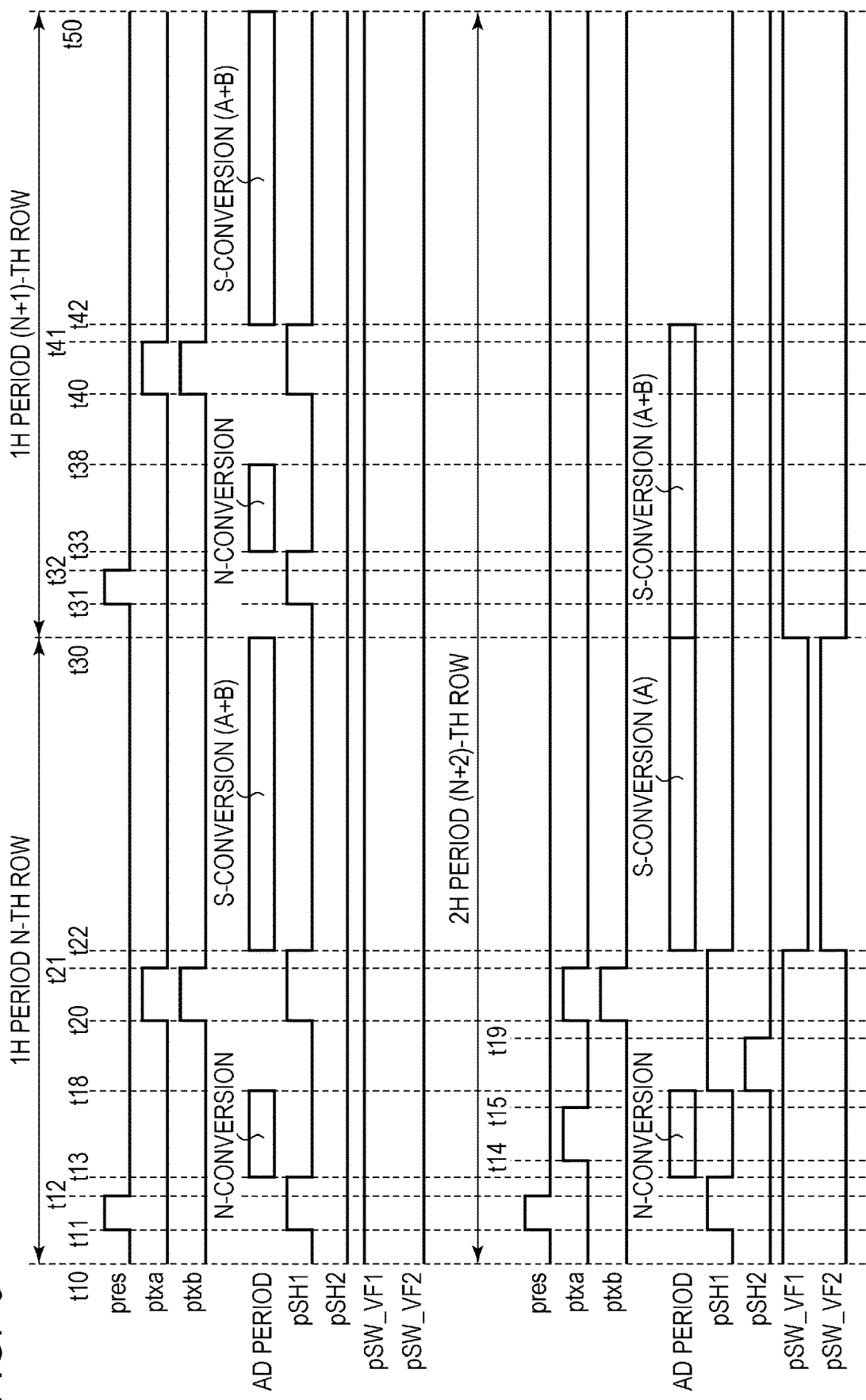
FIG. 9 is a timing chart illustrating a method of driving an imaging device according to a fourth embodiment of the present invention.

The following describes a method of driving an imaging device according to a fourth embodiment of the present invention with reference to FIG. 9. Any component identical to those of the imaging devices according to the first to third embodiments is denoted by an identical reference sign, and description thereof will be omitted or simplified. The driving method described in the present embodiment is another method of driving the imaging device according to the third embodiment.

FIG. 9 is a timing chart illustrating the method of driving the imaging device according to the present embodiment. Similarly to FIG. 8, FIG. 9 illustrates the control signals pres, ptxa, ptxb, pSH1, pSH2, pSW_VF1, and pSW_VF2 and the AD period in the reading operations at the N-th row, the (N+1)-th row, and the (N+2)-th row.

The driving method according to the present embodiment is different from the driving method according to the third embodiment in that the period of the S conversion (A) is performed earlier than the period of the S conversion (A+B) in the reading operation at the (N+2)-th row. The column signal holding circuit 42 illustrated in FIG. 7 includes the two signal holding units C1 and C2, and thus the A+B signal and the A signal can be held by the signal holding units C1 and C2, respectively. With this configuration, the period of the S conversion (A+B) and the period of the S conversion (A) can be performed in an optional order by controlling the switches SW3 and SW4 as appropriate.

The timing chart illustrated in FIG. 9 is same as the timing chart illustrated in FIG. 8 except that the waveforms of the control signals pSW_VF1 and pSW_VF2 are different at time t22 or later in the reading operation at the (N+2)-th row.

Specifically, at time t22 after a pixel signal (A+B signal) is held by the signal holding unit C1, the control signal pSW_VF1 is controlled to become low level from high level, and the control signal pSW_VF2 is controlled to become high level from low level. Accordingly, the switches SW1, SW2, and SW3 are turned off and the switch SW4 is turned on so that a signal held by the signal holding unit C2 is output from the output node 40*o* through the buffer amplifier 48 and the switch SW4.

Then, in the period from time t22 to time t30, the A signal output from the column signal holding circuit 42 of each column is performed to AD conversion (S conversion (A)) at the column AD conversion circuit 52 of each column of the AD conversion unit 50.

Then, at time t30 after the period of the S conversion (A) ends, the control signal pSW_VF1 is controlled to become high level from low level, and the control signal pSW_VF2 is controlled to become low level from high level. Accordingly, the switches SW1, SW2, and SW4 are turned off and the switch SW3 is turned on so that the A+B signal held by the signal holding unit C1 is output from the output node 40*o* through the buffer amplifier 46 and the switch SW3.

Then, in the period from time t30 to time t42, the A+B signal output from the column signal holding circuit 42 of each column is performed to AD conversion (S conversion (A+B)) at the column AD conversion circuit 52 of each column of the AD conversion unit 50.

In this manner, according to the present embodiment, decrease of the image quality attributable to the difference in the timing of reading an image acquisition signal between a row at which only an image acquisition signal is read and a row at which a focal length detection signal and an image acquisition signal are read can be reduced.

Fifth Embodiment

Figure 10:
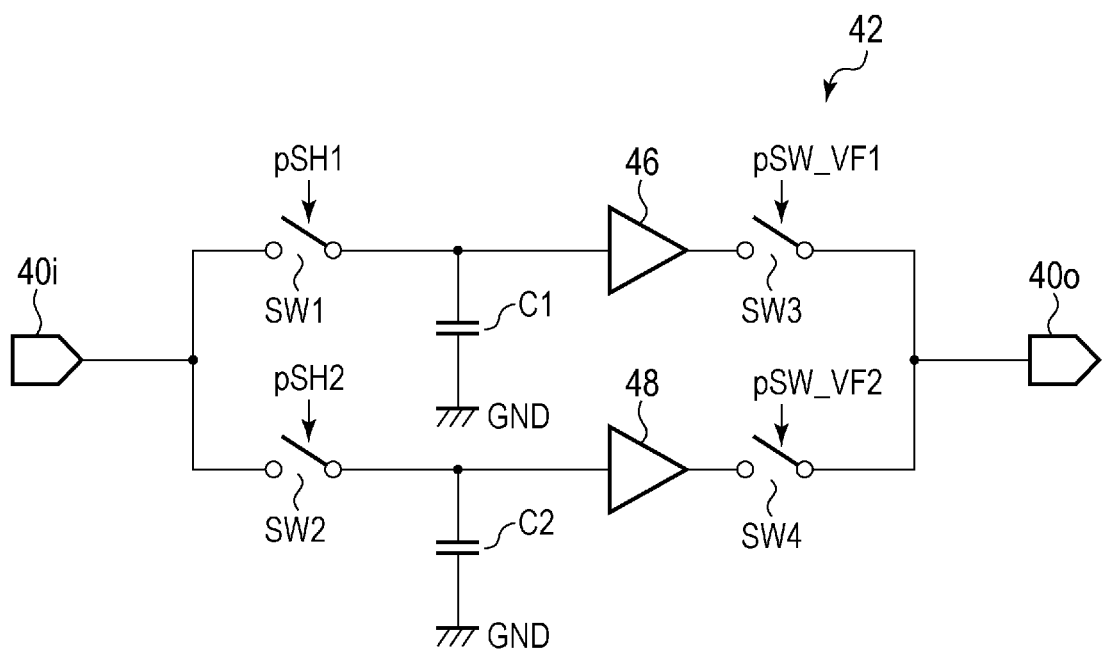
FIG. 10 is a circuit diagram illustrating an exemplary configuration of an analog signal holding unit of an imaging device according to a fifth embodiment of the present invention.
Figure 11:
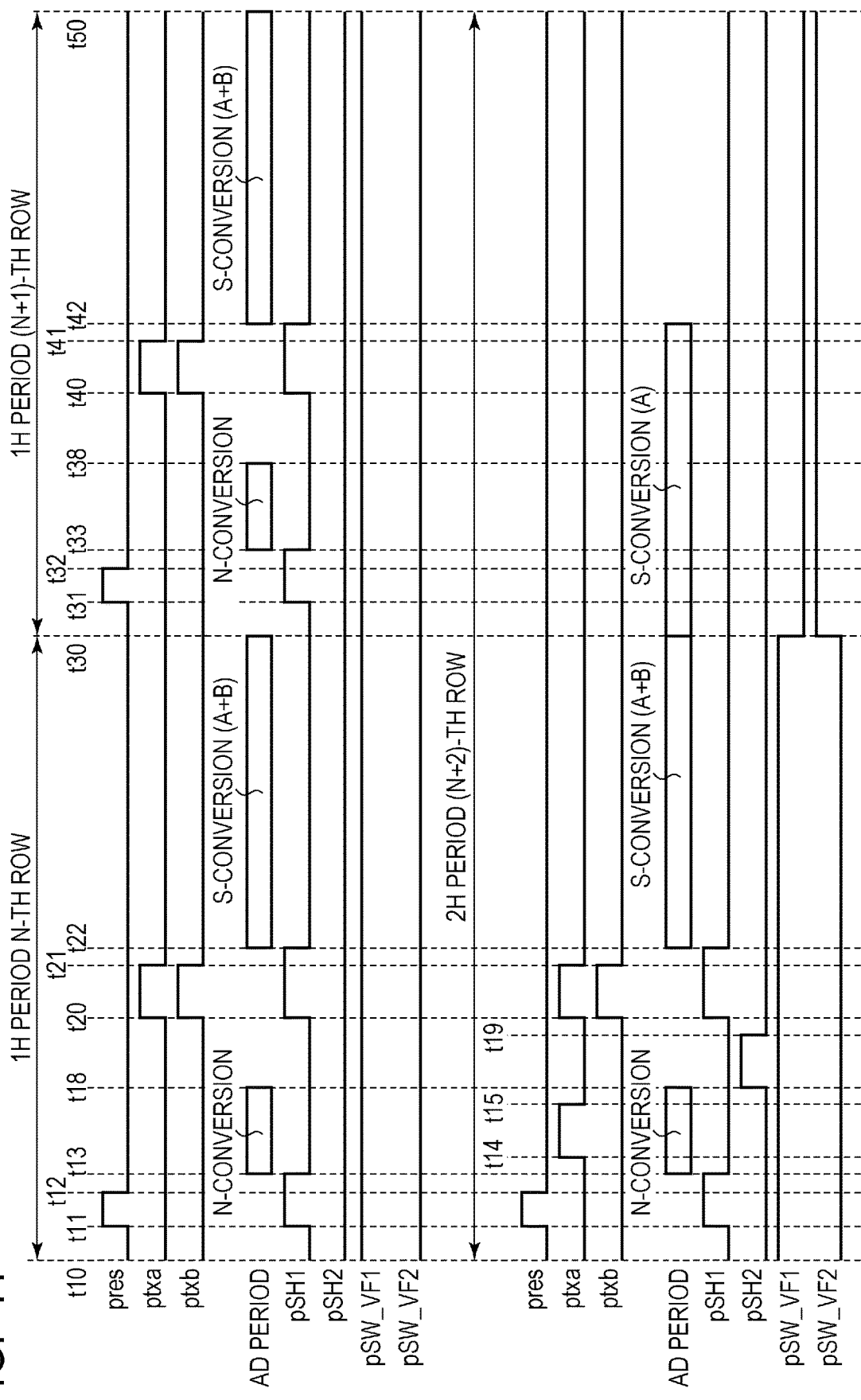
FIG. 11 is a timing chart illustrating a method of driving the imaging device according to the fifth embodiment of the present invention.

The following describes an imaging device and a method of driving the same according to a fifth embodiment of the present invention with reference to FIGS. 10 and 11. Any component identical to those of the imaging devices according to the first to fourth embodiments is denoted by an identical reference sign, and description thereof will be omitted or simplified. FIG. 10 is a circuit diagram illustrating an exemplary configuration of the analog signal holding unit of the imaging device according to the present embodiment. FIG. 11 is a timing chart illustrating the method of driving the imaging device according to the present embodiment.

The imaging device according to the present embodiment is same as the imaging devices according to the first to fourth embodiments except that the column signal holding circuit 42 of each column included in the analog signal holding unit 40 has a different circuit configuration.

As illustrated in FIG. 10, the column signal holding circuit 42 of the imaging device according to the present embodiment includes the input node 40*i*, the switches SW1, SW2, SW3, and SW4, the signal holding units C1 and C2, the buffer amplifiers 46 and 48, and the output node 40*o*. The input node 40*i* is connected with the input terminal of the buffer amplifier 46 one terminal of the signal holding unit C1 through the switch SW1. The input node 40*i* is also connected with the input terminal of the buffer amplifier 48 and the one terminal of the signal holding unit C2 through the switch SW2. The other terminal of the signal holding units C1 and C2 is connected with the ground node (GND). The signal holding units C1 and C2 are, for example, capacitor elements. The output terminal of the buffer amplifier 46 is connected with the output node 40*o* through the switch SW3. The output terminal of the buffer amplifier 48 is connected with the output node 40*o* through the switch SW4.

The switches SW1 and SW2 are used to select the signal holding units C1 and C2 for holding a signal input from the input node 40*i*. When the switch SW1 is turned on, the signal input from the input node 40i is held by the signal holding unit C1. When the switch SW2 is turned on, the signal input from the input node 40i is held by the signal holding unit C2. The buffer amplifiers 46 and 48 are buffer amplifiers, for outputting, from the output node 40o, the signals held by the signal holding units C1 and C2, respectively. The switches SW3 and SW4 are switches for selecting a signal to be output from among the output node 40o among the signals held by the signal holding units C1 and C2. When the switch SW3 is turned on, the signal held by the signal holding unit C1 is output from the output node 40o. When the switch SW4 is turned on, the signal held by the signal holding unit C2 is output from the output node 40o.

The following describes the method of driving the imaging device according to the present embodiment with reference to FIG. 11. In the driving method according to the present embodiment, similarly to the first to third embodiments, the S conversion (A) is performed after the S conversion (A+B) is performed.

FIG. 11 is a timing chart illustrating the method of driving the imaging device according to the present embodiment. FIG. 11 illustrates the control signals pres, ptxa, ptxb, pSH1, pSH2, pSW_VF1, and pSW_VF2 and the AD period that are same as those in FIG. 8. The control signals pSH1, pSH2, pSW_VF1, and pSW_VF2 are supplied from the signal generation unit 44 under control of the timing generator 80.

As illustrated in the timing chart at the upper part of FIG. 11, the reading operation at the N-th row and the (N+1)-th row is same as that in the method of driving the imaging device according to the third embodiment illustrated in FIG. 8, and thus specific description thereof will be omitted below.

In the timing chart illustrated at the lower part of FIG. 11, the period from time t10 to time t42 corresponds to the reading period of the pixels 12 belonging to the (N+2)-th row.

At time t10, the control signals pres, ptxa, ptxb, pSH1, pSH2, and pSW_VF2 are at low level, and the control signal pSW_VF1 is at high level. The initial connection state of the column signal holding circuit 42 is same as that in the reading operation at the N-th row and the (N+1)-th row.

In the subsequent period from time t11 to time t12, the control signal pres of the (N+2)-th row is controlled to become high level to turn on the reset transistor M2 of each pixel 12 belonging to the (N+2)-th row. Accordingly, the FD reset of the pixels 12 belonging to the (N+2)-th row is performed. A pixel signal (N signal) in accordance with the reset voltage of the floating diffusion FD is output from each pixel 12 belonging to the (N+2)-th row to the output line 16 of each column.

In the period from time t11 to time t13, the control signal pSH1 is controlled to become high level to turn on the switch SW1. Accordingly, the input node 40i of the column signal holding circuit 42 of each column and the signal holding unit C1 are connected with each other through the switch SW1 so that the pixel signal (N signal) output from the pixel 12 is held by the signal holding unit C1 through the switch SW1. In this state, since the switch SW3 is on, the N signal held by the signal holding unit C1 is output from the output node 40o through the buffer amplifier 46 and the switch SW3.

Then, in the period from time t13 to time t18 after the switch SW1 is turned off, the N signal output from the column signal holding circuit 42 of each column is performed to AD conversion (N conversion) at the column AD conversion circuit 52 of each column of the AD conversion unit 50.

In the period from time t14 to time t15 overlapping with the period of the N conversion, the control signal ptxa of the (N+2)-th row is controlled to become high level to turn on the transfer transistor M1A of each pixel 12 belonging to the (N+2)-th row. Accordingly, signal electric charge accumulated at the photoelectric converter PDA of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converter PDA. A pixel signal (A signal) in accordance with the amount of the signal electric charge generated at the photoelectric converter PDA is output from each pixel 12 belonging to the (N+2)-th row to the output line 16 of each column.

Then, in the period from time t18 to time t19 after the N conversion ends, the control signal pSH2 is controlled to become high level to turn on the switch SW2. Accordingly, the input node 40i of the column signal holding circuit 42 of each column and the signal holding unit C2 are connected with each other through the switch SW2 so that the pixel signal (A signal) output from the pixel 12 is held by the signal holding unit C2 through the switch SW2.

Then, in the period from time t20 to time t22 after the switch SW2 is turned off, the control signal pSH1 is controlled to become high level to turn on the switch SW1.

In the period from time t20 to time t21, the control signals ptxa and ptxb of the (N+2)-th row are controlled to become high level to turn on the transfer transistors M1A and M1B of each pixel 12 belonging to the (N+2)-th row. Accordingly, signal electric charge accumulated at the photoelectric converters PDA and PDB of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converters PDA and PDB. A pixel signal (A+B signal) in accordance with the amount of the signal electric charge generated at the photoelectric converters PDA and PDB is output from each pixel 12 belonging to the (N+2)-th row to the output line 16 of each column. In this state, since the switch SW1 is on, the A+B signal output from the pixel 12 is held by the signal holding unit C1 through the switch SW1. In this state, since the switch SW3 is on, the A+B signal held by the signal holding unit C1 is output from the output node 40o through the buffer amplifier 46 and the switch SW3.

Then, in the period from time t22 to time t30 after the switch SW1 is turned off, the A+B signal output from the column signal holding circuit 42 of each column is performed to AD conversion (S conversion (A+B)) at the AD conversion unit 50.

Then, at time t30 after the period of the S conversion (A+B) ends, the control signal pSW_VF1 is controlled to become low level from high level, and the control signal pSW_VF2 is controlled to become high level from low level. Accordingly, the switches SW1, SW2, and SW3 are turned off and the switch SW4 is turned on so that a signal held by the signal holding unit C2 is output from the output node 40o through the buffer amplifier 48 and the switch SW4.

Then, in the period from time t30 to time t42, the A signal output from the column signal holding circuit 42 of each column is performed to AD conversion (S conversion (A)) at the column AD conversion circuit 52 of each column of the AD conversion unit 50.

In the above-described driving method according to the present embodiment, the period until the A+B signal is held by the signal holding unit C1 after the FD reset is equal between an image signal acquisition row and a focal length detection signal acquisition row. Accordingly, the change amount of the signal level is equivalent between an image acquisition signal acquired from the image signal acquisition row and an image acquisition signal acquired from the focal length detection signal acquisition row, thereby reducing decrease of the image quality. Similarly to the third and fourth embodiments, the 1H period is reduced as compared to the driving method according to the second embodiment, thereby reducing decrease of the frame rate.

In this manner, according to the present embodiment, decrease of the image quality attributable to the difference in the timing of reading an image acquisition signal between a row at which only an image acquisition signal is read and a row at which a focal length detection signal and an image acquisition signal are read can be reduced.

Sixth Embodiment

Figure 12:
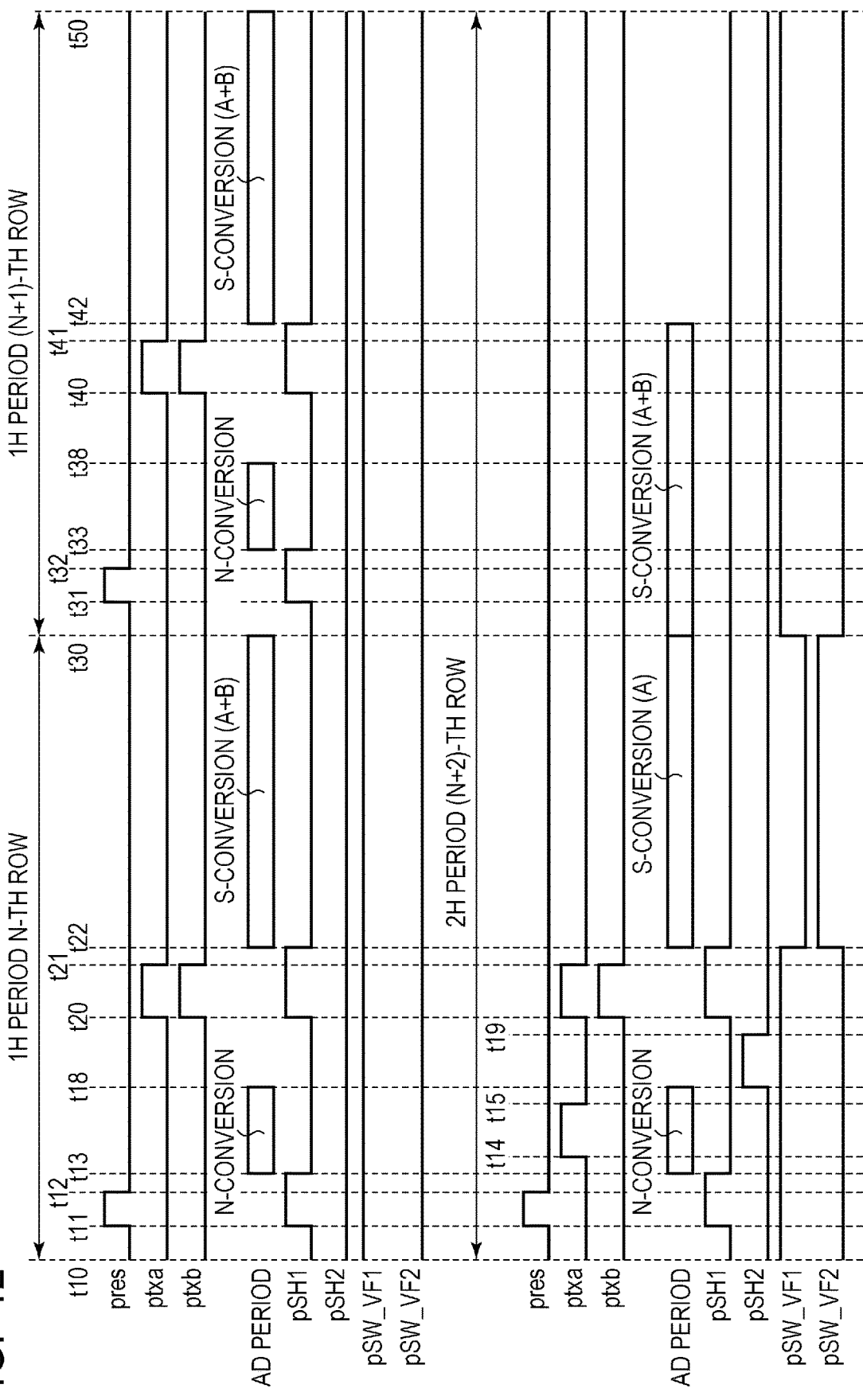
FIG. 12 is a timing chart illustrating a method of driving an imaging device according to a sixth embodiment of the present invention.

The following describes a method of driving an imaging device according to a sixth embodiment of the present invention with reference to FIG. 12. Any component identical to those of the imaging devices according to the first to fifth embodiments is denoted by an identical reference sign, and description thereof will be omitted or simplified. The driving method described in the present embodiment is another method of driving the imaging device according to the fifth embodiment.

FIG. 12 is a timing chart illustrating the method of driving the imaging device according to the present embodiment. Similarly to FIG. 11, FIG. 12 illustrates the control signals pres, ptxa, ptxb, pSH1, pSH2, pSW_VF1, and pSW_VF2 in the reading operations at the N-th row, the (N+1)-th row, and the (N+2)-th row.

The driving method according to the present embodiment is different from the driving method according to the fifth embodiment in that the period of the S conversion (A) is performed earlier than the period of the S conversion (A+B) in the reading operation at the (N+2)-th row. The column signal holding circuit 42 illustrated in FIG. 10 includes the two signal holding units C1 and C2, and thus the A+B signal and the A signal can be held by the signal holding units C1 and C2, respectively. With this configuration, the period of the S conversion (A+B) and the period of the S conversion (A) can be performed in an optional order by controlling the switches SW3 and SW4 as appropriate.

The timing chart illustrated in FIG. 12 is same as the timing chart illustrated in FIG. 11 except that the waveforms of the control signals pSW_VF1 and pSW_VF2 are different at time t22 or later in the reading operation at the (N+2)-th row.

Specifically, at time t22 after a pixel signal (A+B signal) is held by the signal holding unit C1, the control signal pSW_VF1 is controlled to become low level from high level, and the control signal pSW_VF2 is controlled to become high level from low level. Accordingly, the switches SW1, SW2, and SW3 are turned off and the switch SW4 is turned on so that a signal held by the signal holding unit C2 is output from the output node 40o through the buffer amplifier 48 and the switch SW4.

Then, in the period from time t22 to time t30, the A signal output from the column signal holding circuit 42 of each column is performed to AD conversion (S conversion (A)) at the column AD conversion circuit 52 of each column of the AD conversion unit 50.

Then, at time t30 after the period of the S conversion (A) ends, the control signal pSW_VF1 is controlled to become high level from low level, and the control signal pSW_VF2 is controlled to become low level from high level. Accordingly, the switches SW1, SW2, and SW4 are turned off and the switch SW3 is turned on so that the A+B signal held by the signal holding unit C1 is output from the output node 40o through the buffer amplifier 46 and the switch SW3.

Then, in the period from time t30 to time t42, the A+B signal output from the column signal holding circuit 42 of each column is performed to AD conversion (S conversion (A+B)) at the column AD conversion circuit 52 of each column of the AD conversion unit 50.

In this manner, according to the present embodiment, decrease of the image quality attributable to the difference in the timing of reading an image acquisition signal between a row at which only an image acquisition signal is read and a row at which a focal length detection signal and an image acquisition signal are read can be reduced.

Seventh Embodiment

Figure 13A:
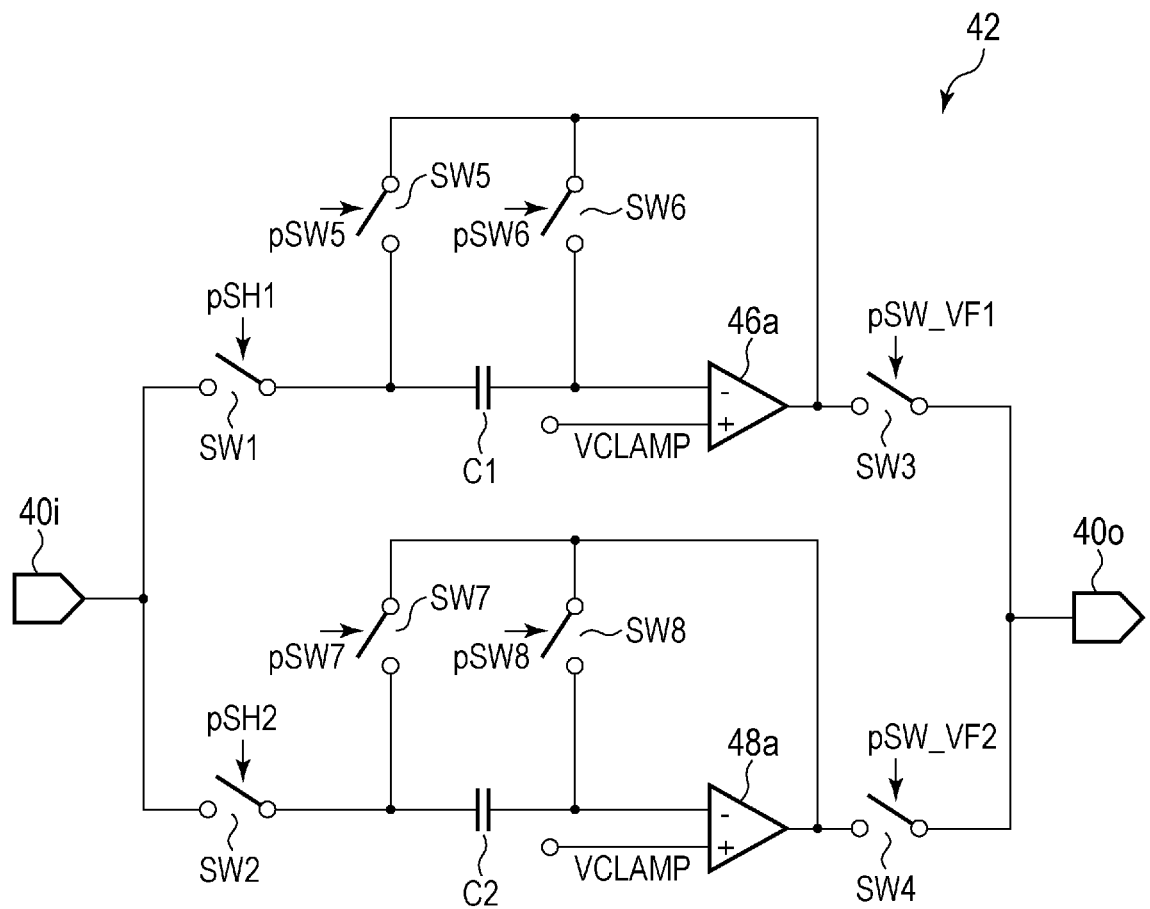
FIG. 13A is a diagram for description of an exemplary configuration of an analog signal holding unit of an imaging device according to a seventh embodiment of the present invention.
Figure 13B:
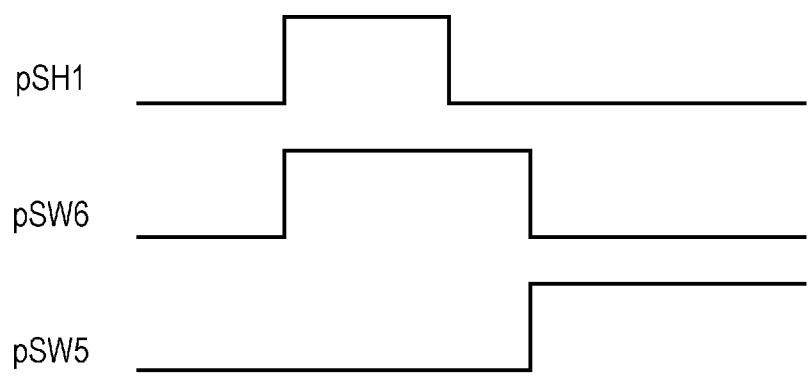
FIG. 13B is a diagram for description of an operation of the analog signal holding unit of the imaging device according to the seventh embodiment of the present invention.
Figure 14:
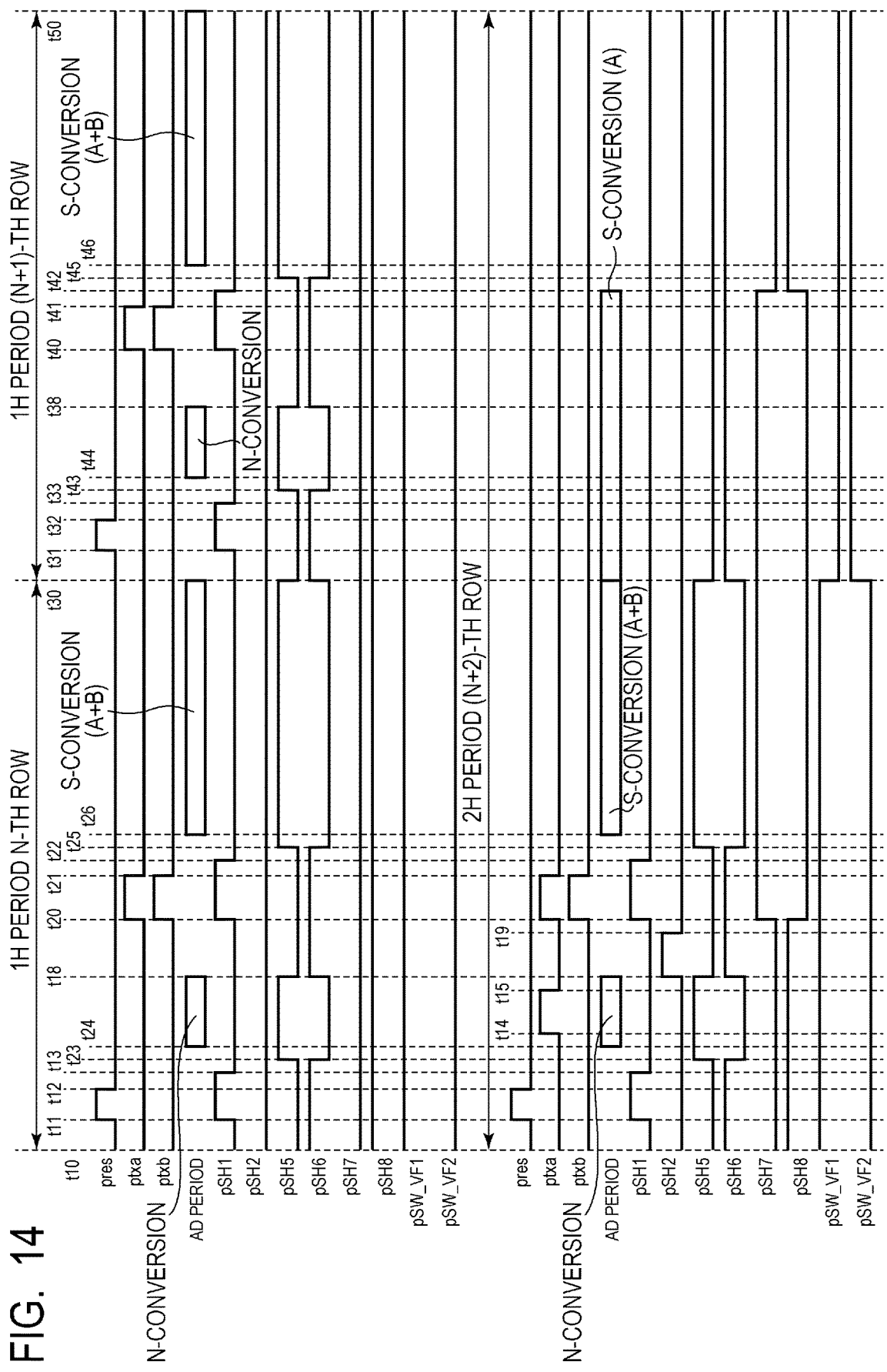
FIG. 14 is a timing chart illustrating a method of driving the imaging device according to the seventh embodiment of the present invention.

The following describes an imaging device and a method of driving the same according to a seventh embodiment of the present invention with reference to FIGS. 13A to 14. Any component identical to those of the imaging devices according to the first to sixth embodiments is denoted by an identical reference sign, and description thereof will be omitted or simplified. FIG. 13A is a diagram for description of the configuration of the analog signal holding unit of the imaging device according to the present embodiment. FIG. 13B is a diagram for description of operation of the analog signal holding unit of the imaging device according to the present embodiment. FIG. 14 is a timing chart illustrating the method of driving the imaging device according to the present embodiment.

The imaging device according to the present embodiment is same as the imaging devices according to the first to sixth embodiments except that the column signal holding circuit 42 of each column included in the analog signal holding unit 40 has a different circuit configuration.

As illustrated in FIG. 13A, the column signal holding circuit 42 of the imaging device according to the present embodiment includes the input node 40i, the switches SW1, SW2, SW3, and SW4, switches SW5, SW6, SW7, and SW8, the signal holding units C1 and C2, differential amplifiers 46a and 48a, and the output node 40o.

The input node 40i is connected with one terminal of the signal holding unit C1 through the switch SW1. The other terminal of the signal holding unit C1 is connected with an inverting input terminal of the differential amplifier 46a. The switch SW5 is connected between the one terminal of the signal holding unit C1 and an output terminal of the differential amplifier 46a. The switch SW6 is connected between the inverting input terminal and output terminal of the differential amplifier 46a. The one terminal and the other terminal of the signal holding unit C1 are connectable with the output terminal of the differential amplifier 46a by controlling the connection states of the switches SW5 and SW6. A voltage VCLAMP is supplied to a non-inverting input terminal of the differential amplifier 46a. The output terminal of the differential amplifier 46a is connected with the output node 40o through the switch SW3.

Similarly, the input node 40i is connected with one terminal of the signal holding unit C2 through the switch SW2. The other terminal of the signal holding unit C2 is connected with an inverting input terminal of the differential amplifier 48a. The switch SW7 is connected between the one terminal of the signal holding unit C2 and an output terminal of the differential amplifier 48a. The switch SW8 is connected between the inverting input terminal and output terminal of the differential amplifier 48a. The one terminal of the signal holding unit C2 and the other terminal are connectable with the output terminal of the differential amplifier 48a by controlling the connection states of the switches SW7 and SW8. The voltage VCLAMP is supplied to a non-inverting input terminal of the differential amplifier 48a. The output terminal of the differential amplifier 48a is connected with the output node 40o through the switch SW4.

The switches SW5 and SW6 are used to perform an offset removal operation to remove offset of the differential amplifier 46a. The switches SW7 and SW8 are used to perform an offset removal operation to remove offset of the differential amplifier 48a. In other words, the differential amplifiers 46a and 48a of the column signal holding circuit 42 of the imaging device according to the present embodiment each have a function of removing offset. The connection states of the switches SW5 SW6, SW7, and SW8 are controlled by control signals pSW5, pSW6, pSW7, and pSW8, respectively. In the present embodiment, each switch becomes the conduction state when the corresponding control signal is at high level, or becomes the non-conduction state when the corresponding control signal is at low level. However, the relation between the connection state of the switch and the signal level of the control signal may be opposite to that in the present embodiment.

The offset removal operations of the differential amplifiers 46a and 48a of the column signal holding circuit 42 according to the present embodiment will be described below based on an example of the differential amplifier 46a with reference to FIG. 13B.

When the control signal pSH1 is at high level and the switch SW1 is on, the control signal pSW6 is controlled to become high level to turn on the switch SW6. While the switch SW6 is on, the control signal pSW5 is controlled to become low level to turn off the switch SW5. Accordingly, the inverting input terminal and output terminal of the differential amplifier 46a are connected with each other through the switch SW6 so that the differential amplifier 46a functions as a voltage follower. In this case, when an output voltage and an offset voltage of the differential amplifier 46a are represented by Vout and Vofst, respectively, and a reference voltage input to the non-inverting input terminal thereof is represented by VCLAMP, the output voltage Vout is expressed as described below.

$$Vout = VCLAMP - Vofst$$

When an input voltage input from each pixel 12 through the output line 16 and the switch SW1 is represented by Vin, a voltage ΔVin as the difference between the input voltage Vin and the output voltage Vout of the differential amplifier 46a is applied to the signal holding unit C1. In other words, the voltage ΔVin is expressed as described below.

$$\Delta Vin = Vin - VCLAMP - Vofst$$

In this state, the control signal pSH1 is controlled to become low level to turn off the switch SW1, and then the control signal pSW6 is controlled to become low level to turn off the switch SW6, and the control signal pSW5 is controlled to become high level to turn on the switch SW5. When the output voltage of the differential amplifier 46a in this state is represented by Vout2, the output voltage Vout2 is expressed as described below.

$$Vout2 = Vout + \Delta Vin$$
$$= (VCLAMP + Vofst) + (Vin - VCLAMP - Vofst)$$
$$= Vin$$

Through this operation, the offset (offset voltage Vofst) of the differential amplifier 46a is removed from the output voltage Vout2 of the differential amplifier 46a. In addition, the offset of the differential amplifier 48a is reduced or removed through an operation same as that for the differential amplifier 46a.

When the N signal and the S signal (A+B signal) are output through the differential amplifier 46a, and the S signal (A signal) is output through the differential amplifier 48a, fixed pattern noise is generated due to the offset difference between the differential amplifiers 46a and 48a in some cases. However, the offsets of the differential amplifiers 46a and 48a can be reduced or removed from the A image signal after S-N through the offset removal operation on the differential amplifiers 46a and 48a as in the present embodiment. Accordingly, the fixed pattern noise attributable to the offset difference between the differential amplifiers 46a and 48a is reduced.

The following describes the method of driving the imaging device according to the present embodiment with reference to FIG. 14. In the driving method according to the present embodiment, similarly to the first to third and fifth embodiments, the S conversion (A) is performed after the S conversion (A+B) is performed.

FIG. 14 is a timing chart illustrating the method of driving the imaging device according to the present embodiment. FIG. 14 illustrates the control signals pres, ptxa, ptxb, pSH1, pSH2, pSW5, pSW6, pSW7, pSW8, pSW_VF1, and pSW_VF2 and the AD period. The control signals pSH1, pSH2, pSW5, pSW6, pSW7, pSW8, pSW_VF1, and pSW_VF2 are supplied from the signal generation unit 44 under control of the timing generator 80.

The basic operation of the method of driving the imaging device according to the present embodiment is same as that of the method of driving the imaging device according to the fifth embodiment in that the offset removal operation is performed on the differential amplifiers 46a and 48a before the period of AD conversion of each pixel signal. Specifically, in the method of driving the imaging device according to the present embodiment, the offset removal operation is performed on the differential amplifiers 46a and 48a at timings corresponding to time t13, time t22, time t33, and time t42 in FIG. 11.

In the timing chart at the upper part of FIG. 14, the period from time t10 to time t30 corresponds to one horizontal period (1H period), and the reading operation of the pixels 12 belonging to the N-th row is performed in the 1H period.

At time t10, the control signals pres, ptxa, ptxb, pSH1, pSH2, pSW5, pSW7, and pSW_VF2 are at low level, and the control signals pSW6, pSW8, and pSW_VF1 are at high level.

In the subsequent period from time t11 to time t12, the control signal pres of the N-th row is controlled to become high level to turn on the reset transistor M2 of each pixel 12 belonging to the N-th row. Accordingly, the FD reset of each pixel 12 belonging to the N-th row is performed. A pixel signal (N signal) in accordance with the reset voltage of the floating diffusion FD is output from each pixel 12 belonging to the N-th row to the output line 16 of each column.

In the period from time t11 to time t13, the control signal pSH1 is controlled to become high level to turn on the switch SW1. Accordingly, the input node 40$i$ of the column signal holding circuit 42 of each column and the signal holding unit C1 are connected with each other through the switch SW1 so that the pixel signal (N signal) output from the pixel 12 is held by the signal holding unit C1 through the switch SW1. In this state, since the switch SW3 is on, an output node of the differential amplifier 46$a$ is connected with the output node 40$o$ through the switch SW3.

Then, at time t23 after the switch SW1 is turned off, the control signal pSW5 is controlled to become high level from low level, and the control signal pSW6 is controlled to become low level from high level. Accordingly, the switch SW6 is turned off and the switch SW5 is turned on, thereby removing an offset from the output voltage of the differential amplifier 46$a$.

Then, in the period from time t24 to time t18 after the offset of the differential amplifier 46$a$ is removed, the N signal output from the column signal holding circuit 42 of each column is performed to AD conversion (N conversion) at the column AD conversion circuit 52 of each column of the AD conversion unit 50.

Then, at time t18 after the N conversion ends, the control signal pSW5 is controlled to become low level from high level, and the control signal pSW6 is controlled to become high level from low level. Accordingly, the switch SW6 is turned on, and the switch SW5 is turned off.

Then, in the period from time t20 to time t21, the control signals ptxa and ptxb of the N-th row are controlled to become high level to turn on the transfer transistors M1A and M1B of each pixel 12 belonging to the N-th row. Accordingly, signal electric charge accumulated at the photoelectric converters PDA and PDB of each pixel 12 belonging to the N-th row is transferred to the floating diffusion FD. Then, the floating diffusion FD of each pixel 12 belonging to the N-th row becomes at a voltage in accordance with the amount of the signal electric charge transferred from the photoelectric converters PDA and PDB. A pixel signal (A+B signal) in accordance with the amount of the signal electric charge generated at the photoelectric converters PDA and PDB is output from each pixel 12 belonging to the N-th row to the output line 16 of each column.

In the period from time t20 to time t22, the control signal pSH1 is controlled to become high level to turn on the switch SW1. Accordingly, the input node 40$i$ of the column signal holding circuit 42 of each column and the signal holding unit C1 are connected with each other through the switch SW1 so that the pixel signal (A+B signal) output from the pixel 12 is held by the signal holding unit C1 through the switch SW1. In this state, since the switch SW3 is on, the A+B signal held by the signal holding unit C1 is output from the output node 40$o$ through the differential amplifier 46$a$ and the switch SW3.

Then, at time t25 after the switch SW1 is turned off, the control signal pSW5 is controlled to become high level from low level, and the control signal pSW6 is controlled to become low level from high level. Accordingly, the switch SW6 is turned off and the switch SW5 is turned on, thereby removing an offset from the output voltage of the differential amplifier 46$a$.

Then, in the period from time t26 to time t30 after the offset of the differential amplifier 46$a$ is removed, the A+B signal output from the column signal holding circuit 42 of each column is performed to AD conversion (S conversion (A+B)) at the column AD conversion circuit 52 of each column of the AD conversion unit 50.

Then, at time t30 after the S conversion (A+B) ends, the control signal pSW5 is controlled to become low level from high level, and the control signal pSW6 is controlled to become high level from low level. Accordingly, the switch SW6 is turned on, and the switch SW5 is turned off.

In the timing chart at the upper part of FIG. 14, the period from time t30 to time t50 corresponds to one horizontal period, and the reading operation of each pixel 12 belonging to the (N+1)-th row is performed in the 1H period, similarly to that for the N-th row. The reading operation of the (N+1)-th row is performed in a similar manner at a timing same as that of the reading operation of the N-th row except that the start time thereof shifts from time t10 to time t30, and thus specific description thereof will be omitted below.

In the timing chart illustrated at the lower part of FIG. 14, the period from time t10 to time t42 corresponds to the reading period of the pixels 12 belonging to the (N+2)-th row.

At time t10, the control signals pres, ptxa, ptxb, pSH1, pSH2, pSW5, pSW7, and pSW_VF2 are at low level, and the control signals pSW6, pSW8, and pSW_VF1 are at high level.

In the subsequent period from time t11 to time t12, the control signal pres of the (N+2)-th row is controlled to become high level to turn on the reset transistor M2 of each pixel 12 belonging to the (N+2)-th row. Accordingly, the FD reset of the pixels 12 belonging to the (N+2)-th row is performed. A pixel signal (N signal) in accordance with the reset voltage of the floating diffusion FD is output from each pixel 12 belonging to the (N+2)-th row to the output line 16 of each column.

In the period from time t11 to time t13, the control signal pSH1 is controlled to become high level to turn on the switch SW1. Accordingly, the input node 40$i$ of the column signal holding circuit 42 of each column and the signal holding unit C1 are connected with each other through the switch SW1 so that the pixel signal (N signal) output from the pixel 12 is held by the signal holding unit C1 through the switch SW1. In this state, since the switch SW3 is on, the output node of the differential amplifier 46$a$ is connected with the output node 40$o$ through the switch SW3.

Then, at time t23 after the switch SW1 is turned off, the control signal pSW5 is controlled to become high level from low level, and the control signal pSW6 is controlled to become low level from high level. Accordingly, the switch SW6 is turned off and the switch SW5 is turned on, thereby removing an offset from the output voltage of the differential amplifier 46$a$.

Then, in the period from time t24 to time t18 after the offset of the differential amplifier 46$a$ is removed, the N signal output from the column signal holding circuit 42 of each column is performed to AD conversion (N conversion) at the column AD conversion circuit 52 of each column of the AD conversion unit 50.

In the period from time t14 to time t15 overlapping with the period of the N conversion, the control signal ptxa of the (N+2)-th row is controlled to become high level to turn on the transfer transistor M1A of each pixel 12 belonging to the (N+2)-th row. Accordingly, signal electric charge accumulated at the photoelectric converter PDA of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converter PDA. A pixel signal (A signal) in accordance with the amount of the signal electric charge generated at the photoelectric converter PDA is output from each pixel 12 belonging to the (N+2)-th row to the output line 16 of each column.

Then, in the period from time t18 to time t19 after the N conversion ends, the control signal pSH2 is controlled to become high level to turn on the switch SW2. Accordingly, the input node 40i of the column signal holding circuit 42 of each column and the signal holding unit C2 are connected with each other through the switch SW2 so that the pixel signal (A signal) output from the pixel 12 is held by the signal holding unit C2 through the switch SW2.

Then, in the period from time t20 to time t21 after the switch SW2 is turned off, the control signals ptxa and ptxb of the (N+2)-th row are controlled to become high level to turn on the transfer transistors M1A and M1B of each pixel 12 belonging to the (N+2)-th row. Accordingly, signal electric charge accumulated at the photoelectric converters PDA and PDB of each pixel 12 belonging to the (N+2)-th row is transferred to the floating diffusion FD. Then, the floating diffusion FD of each pixel 12 belonging to the (N+2)-th row becomes at a voltage in accordance with the amount of the signal electric charge transferred from the photoelectric converters PDA and PDB. A pixel signal (A+B signal) in accordance with the amount of the signal electric charge generated at the photoelectric converters PDA and PDB is output from each pixel 12 belonging to the (N+2)-th row to the output line 16 of each column. In this state, since the switch SW1 is on, the A+B signal output from the pixel 12 is held by the signal holding unit C1 through the switch SW1. In this state, since the switch SW3 is on, the output node of the differential amplifier 46a is connected with the output node 40o through the switch SW3.

In the period from time t21 to time t22, the control signal pSH1 is controlled to become high level to continuously turn on the switch SW1. In other words, in the period from time t20 to time t22, the input node 40i of the column signal holding circuit 42 of each column and the signal holding unit C1 are connected with each other through the switch SW1 so that the pixel signal (A+B signal) output from the pixel 12 is held by the signal holding unit C1 through the switch SW1.

In the period from time t20 to time t42, the control signal pSW7 is controlled to become high level from low level, and the control signal pSW8 is controlled to become low level from high level. Accordingly, the switch SW8 is turned off and the switch SW7 is turned on, thereby removing an offset from the output voltage of the differential amplifier 48a.

Then, in the period from time t25 to time t30 after the switch SW1 is turned off, the control signal pSW5 is controlled to become high level from low level, and the control signal pSW6 is controlled to become low level from high level. Accordingly, the switch SW6 is turned off and the switch SW5 is turned on, thereby removing an offset from the output voltage of the differential amplifier 46a.

Then, in the period from time t26 to time t30 after the offset of the differential amplifier 46a is removed, the A+B signal output from the column signal holding circuit 42 of each column is performed to AD conversion (S conversion (A+B)) at the AD conversion unit 50.

Then, at time t30 after the period of the S conversion (A+B) ends, the control signal pSW_VF1 is controlled to become low level from high level, and the control signal pSW_VF2 is controlled to become high level from low level. Accordingly, the switch SW3 is turned off and the switch SW4 is turned on so that the A signal held by the signal holding unit C2 is output from the output node 40o through the differential amplifier 48a and the switch SW4.

Then, in the period from time t30 to time t42, the A signal output from the column signal holding circuit 42 of each column is performed to AD conversion (S conversion (A)) at the column AD conversion circuit 52 of each column of the AD conversion unit 50.

Then, at time t42 after the S conversion (A) ends, the control signal pSW7 is controlled to become low level from high level, and the control signal pSW8 is controlled to become high level from low level. Accordingly, the switch SW7 is turned on, and the switch SW8 is turned off.

In the above-described driving method according to the present embodiment, the period until the A+B signal is held by the signal holding unit C1 after the FD reset is equal between an image signal acquisition row and a focal length detection signal acquisition row. Accordingly, the change amount of the signal level is equivalent between an image acquisition signal acquired from the image signal acquisition row and an image acquisition signal acquired from the focal length detection signal acquisition row, thereby reducing decrease of the image quality. In addition, similarly to the third and fourth embodiments, the 1H period is reduced as compared to the driving method according to the second embodiment, thereby reducing decrease of the frame rate. Accordingly, pattern noise attributable to the offset difference between the differential amplifiers 46a and 48a is reduced.

In this manner, according to the present embodiment, decrease of the image quality attributable to the difference in the timing of reading an image acquisition signal between a row at which only an image acquisition signal is read and a row at which a focal length detection signal and an image acquisition signal are read can be reduced.

Eighth Embodiment

Figure 15:
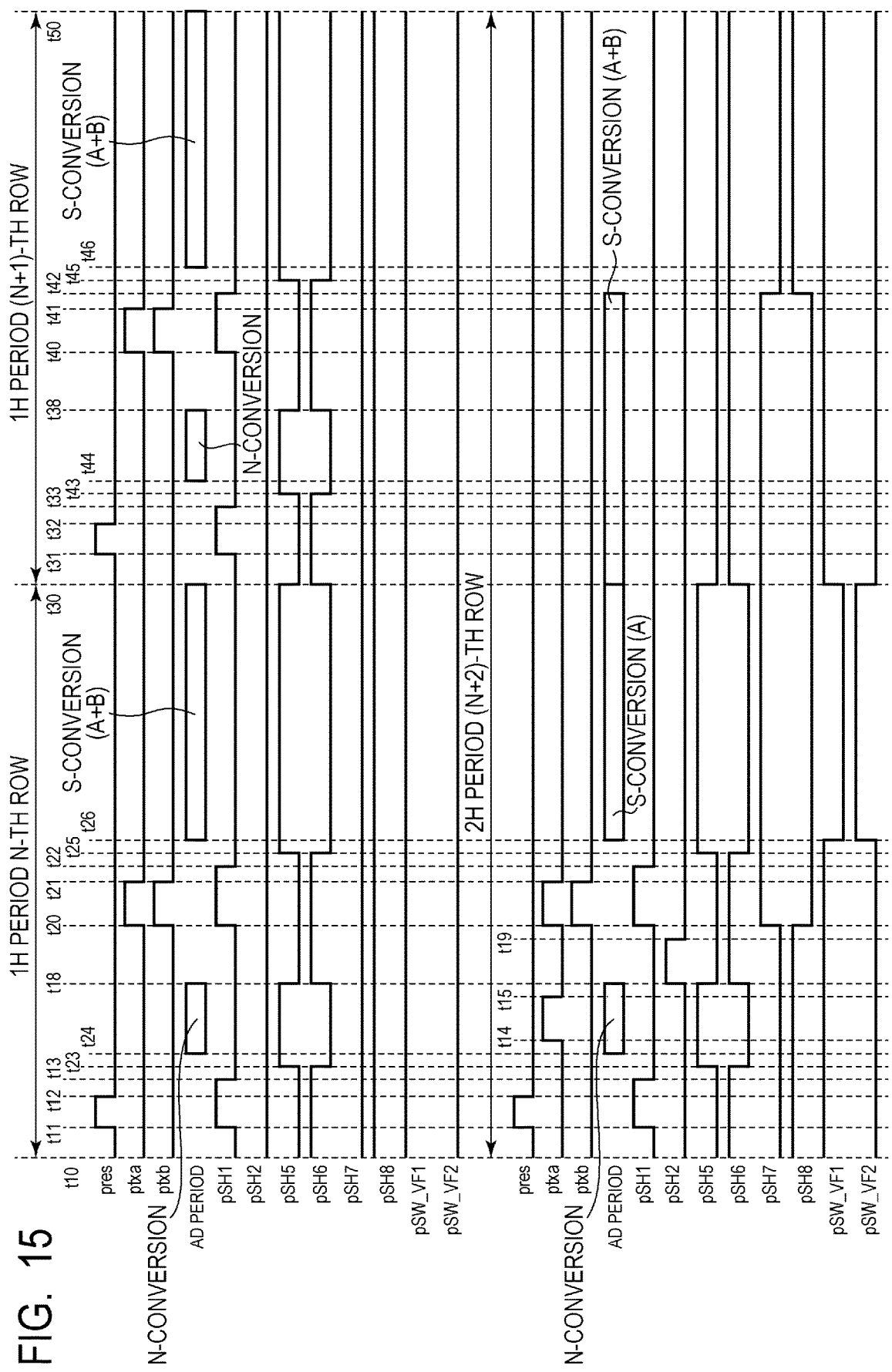
FIG. 15 is a timing chart illustrating a method of driving an imaging device according to an eighth embodiment of the present invention.

The following describes a method of driving an imaging device according to an eighth embodiment of the present invention with reference to FIG. 15. Any component identical to those of the imaging devices according to the first to seventh embodiments is denoted by an identical reference sign, and description thereof will be omitted or simplified. The driving method described in the present embodiment is another method of driving the imaging device according to the seventh embodiment.

FIG. 15 is a timing chart illustrating the method of driving the imaging device according to the present embodiment. Similarly to FIG. 14, FIG. 15 illustrates the control signals pres, ptxa, ptxb, pSH1, pSH2, pSW5, pSW6, pSW7, pSW8, pSW_VF1, and pSW_VF2 in the reading operations at the N-th row, the (N+1)-th row, and the (N+2)-th row.

The driving method according to the present embodiment is different from the driving method according to the seventh embodiment in that the period of the S conversion (A) is performed earlier than the period of the S conversion (A+B) in the reading operation at the (N+2)-th row. The column signal holding circuit 42 illustrated in FIG. 13A includes the two signal holding units C1 and C2, and thus the A+B signal and the A signal can be held by the signal holding units C1 and C2, respectively. With this configuration, the period of the S conversion (A+B) and the period of the S conversion (A) can be performed in an optional order by controlling the switches SW3 and SW4 as appropriate.

The timing chart illustrated in FIG. 15 is same as the timing chart illustrated in FIG. 14 except that the waveforms of the control signals pSW_VF1 and pSW_VF2 are different at time t26 or later in the reading operation at the (N+2)-th row.

Specifically, at time t26 after a pixel signal (A+B signal) is held by the signal holding unit C1, the control signal pSW_VF1 is controlled to become low level from high level, and the control signal pSW_VF2 is controlled to become high level from low level. Accordingly, the switch SW3 is turned off and the switch SW4 is turned on so that the A signal held by the signal holding unit C2 is output from the output node 40o through the differential amplifier 48a and the switch SW4.

Then, in the period from time t26 to time t30, the A signal output from the column signal holding circuit 42 of each column is performed to AD conversion (S conversion (A)) at the column AD conversion circuit 52 of each column of the AD conversion unit 50.

Then, at time t30 after the period of the S conversion (A) ends, the control signal pSW_VF1 is controlled to become high level from low level, and the control signal pSW_VF2 is controlled to become low level from high level. Accordingly, the switch SW4 is turned off and the switch SW3 is turned on so that the A+B signal held by the signal holding unit C1 is output from the output node 40o through the differential amplifier 46a and the switch SW3.

Then, in the period from time t30 to time t42, the A+B signal output from the column signal holding circuit 42 of each column is performed to AD conversion (S conversion (A+B)) at the column AD conversion circuit 52 of each column of the AD conversion unit 50.

In the above-described driving method according to the present embodiment, pattern noise attributable to the offset difference between the differential amplifiers 46a and 48a is reduced.

In this manner, according to the present embodiment, decrease of the image quality attributable to the difference in the timing of reading an image acquisition signal between a row at which only an image acquisition signal is read and a row at which a focal length detection signal and an image acquisition signal are read can be reduced.

Ninth Embodiment

Figure 16:
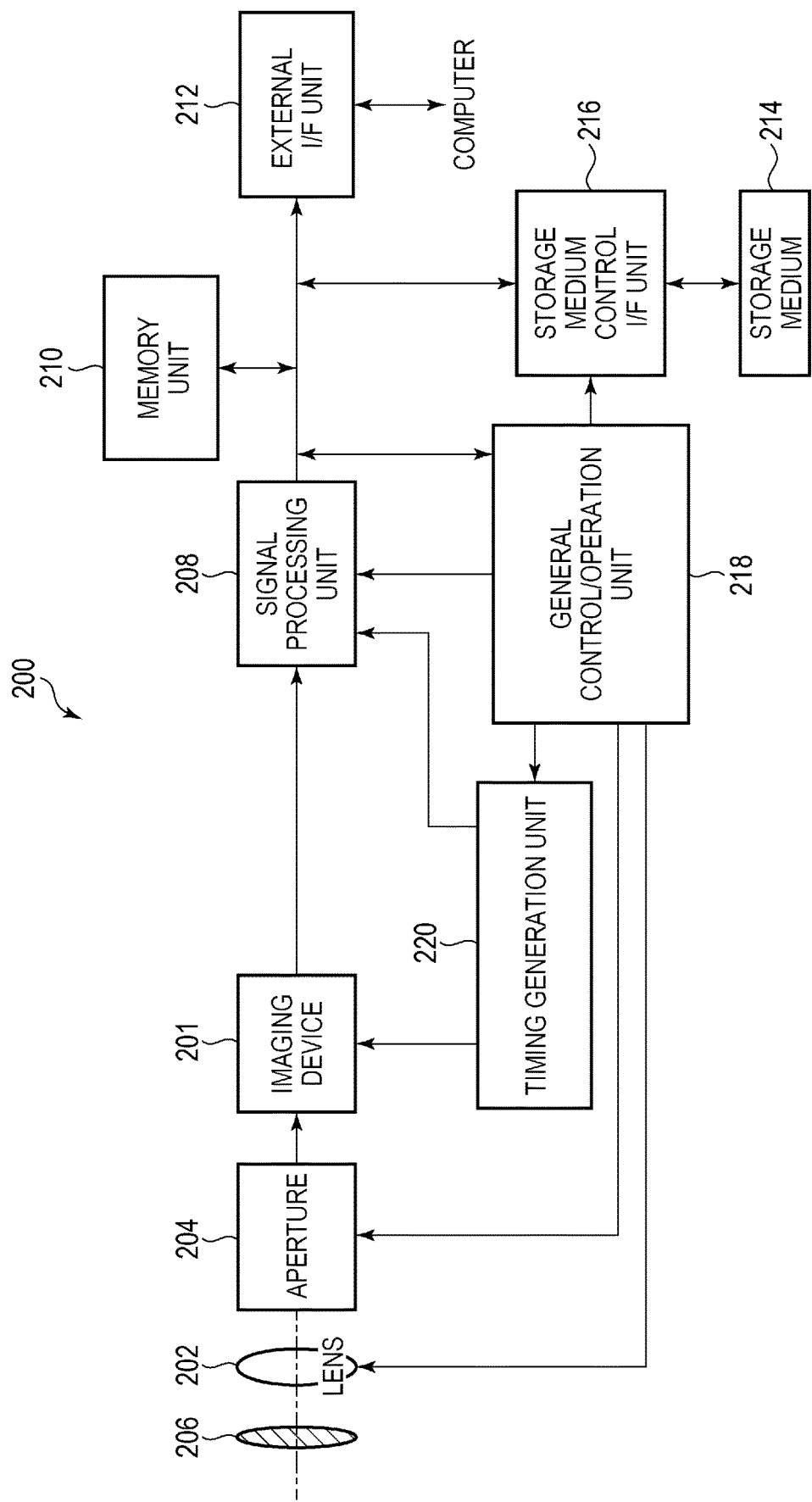
FIG. 16 is a block diagram illustrating a schematic configuration of an imaging system according to a ninth embodiment of the present invention.

An imaging system according to a ninth embodiment of the present invention will be described with FIG. 16. FIG. 16 is a block diagram illustrating a general configuration of the imaging system according to the present embodiment.

The imaging system 200 of the present embodiment includes an imaging device 201 to which the configuration of the imaging device 100 described in any of the first to eighth embodiments described above is applied. Specific examples of the imaging system 200 may include a digital still camera, a digital camcorder, a surveillance camera, and the like. FIG. 16 illustrates a configuration example of a digital still camera to which the imaging device 100 described in any of respective embodiments described above is applied.

The imaging system 200 illustrated as an example in FIG. 16 includes the imaging device 201, a lens 202 that captures an optical image of an object onto a capturing surface of the imaging device 201, an aperture 204 for changing a light amount passing through the lens 202, and a barrier 206 for protecting the lens 202. The lens 202 and the aperture 204 form an optical system that converges a light onto the imaging device 201.

The imaging system 200 further includes a signal processing unit 208 that processes an output signal output from the imaging device 201. The signal processing unit 208 performs a signal processing operation of performing various correction and compression on an input signal for output, if necessary. For example, the signal processing unit 208 applies predetermined image processing such as a conversion process for converting RGB pixel output signals to the Y, Cb, and Cr color space or gamma correction on the input signal.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that performs various operations and controls the entire digital still camera and a timing generation unit 220 that outputs various timing signals to the imaging device 201 and the signal processing unit 208. Here, the timing signal or the like may be input from the outside, and the imaging system 200 may have at least the imaging device 201 and the signal processing unit 208 that processes an output signal output from the imaging device 201. The general control/operation unit 218 and the timing generation unit 220 may be configured to perform a part or all of the control function of the imaging device 201.

The imaging device 201 outputs an imaging signal to the signal processing unit 208. The signal processing unit 208 performs predetermined signal processing on an imaging signal output from the imaging device 201 and outputs image data. Further, the signal processing unit 208 uses an imaging signal to generate an image. An image generated by the signal processing unit 208 is stored in the storage medium 214, for example. Further, an image generated by the signal processing unit 208 is displayed as a moving image or a static image on a monitor such as a liquid crystal display. The image stored in the storage medium 214 can be hard-copied by a printer or the like.

By using the imaging device of each of the embodiments described above to configure an imaging system, an imaging system that can acquire better quality images can be realized.

Tenth Embodiment

Figure 17A:
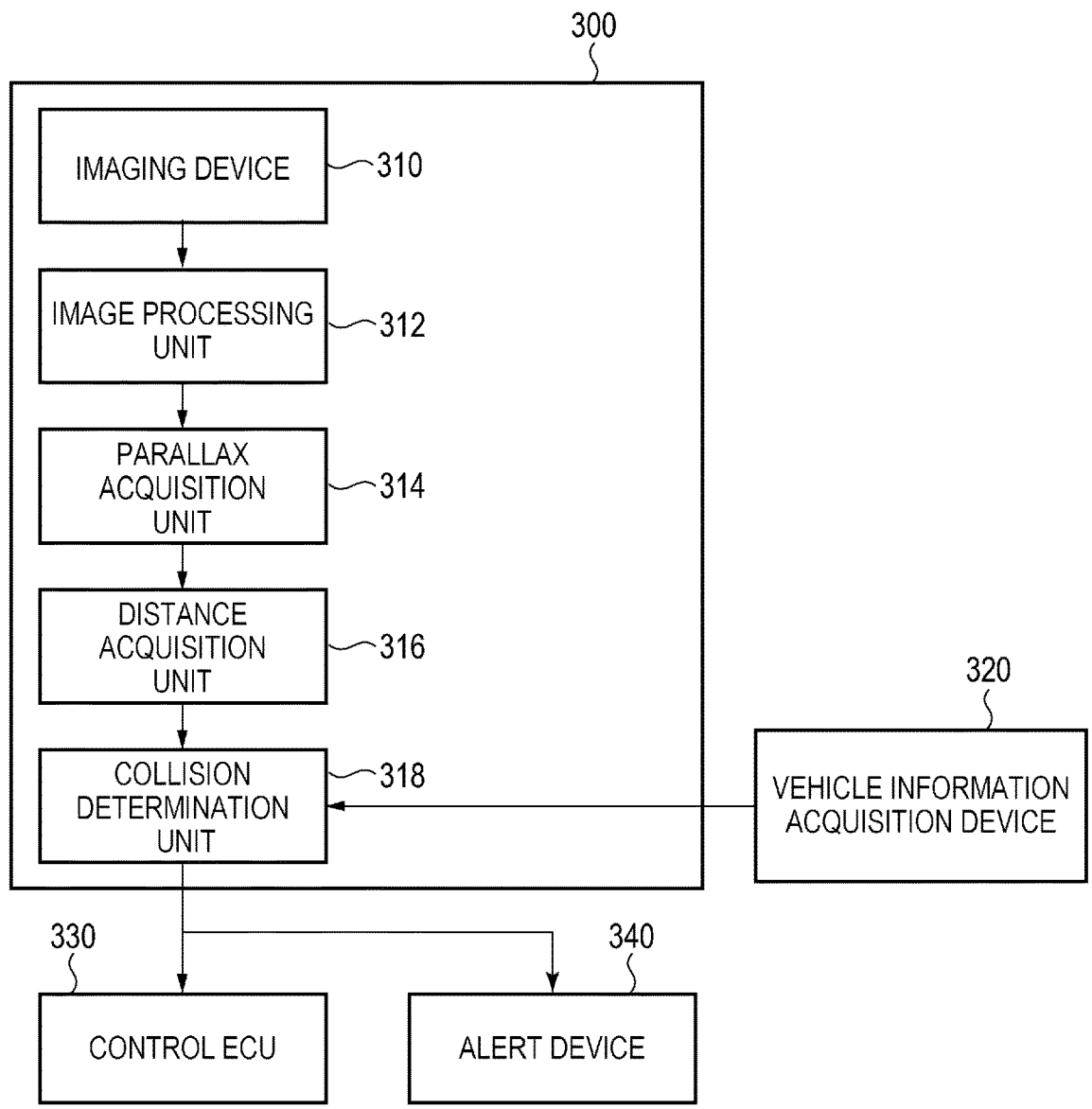
FIG. 17A is a diagram illustrating an imaging system according to a tenth embodiment of the present invention.
Figure 17B:
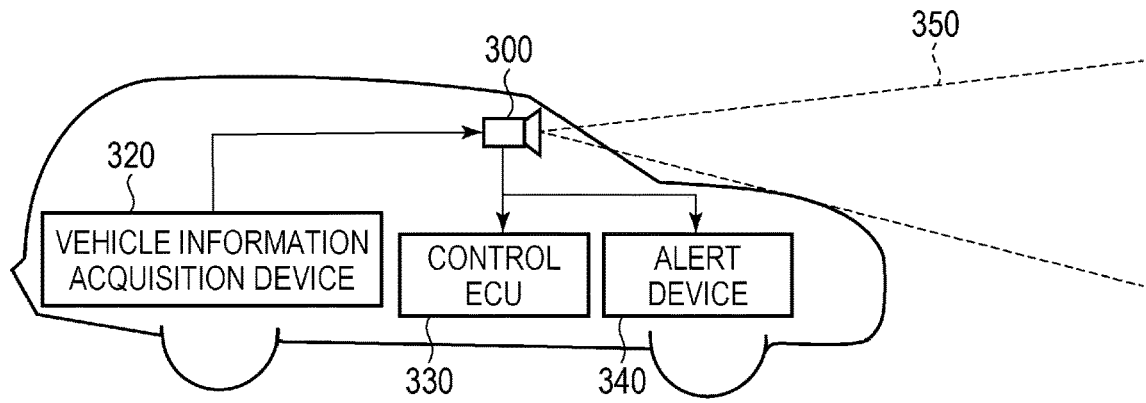
FIG. 17B is a diagram illustrating an exemplary configuration of a movable object according to the tenth embodiment of the present invention.

An imaging system and a movable object according to a tenth embodiment of the present invention will be described with reference to FIG. 17A and FIG. 17B. FIG. 17A is a diagram illustrating a configuration of an imaging system according to the present embodiment. FIG. 17B is a diagram illustrating a configuration of a movable object according to the present embodiment.

FIG. 17A illustrates an example of an imaging system 300 related to an on-vehicle camera. The imaging system 300 includes an imaging device 310. The imaging device 310 is any of the imaging devices 100 described in respective embodiments described above. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging device 310. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. That is, the control ECU 330 is an example of a movable object control unit that controls a movable object based on the distance information. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 17B illustrates the imaging system 300 in a case of capturing a front area of a vehicle (a capturing area 350). The vehicle information acquisition device 320 transmits instructions to operate the imaging system 300 to perform capturing an image. A use of the imaging device 100 of each of the embodiments described above allows the imaging system 300 of the present embodiment to further improve the ranging accuracy.

Although the example of control for avoiding a collision to another vehicle has been described, the embodiment is applicable to automatic driving control for following another vehicle, automatic driving control for not going out of a traffic lane, or the like. Furthermore, the imaging system is not limited to a vehicle such as the subject vehicle, and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

[Modifications]

The present invention is not limited to the above-described embodiments but may be modified in various manners.

The embodiments of the present invention include an example achieved by adding a partial configuration of any of the embodiments to another embodiment, and an example achieved by replacing the partial configuration with a partial configuration of another embodiment.

The circuit configuration of each pixel 12 is not limited to that illustrated in FIG. 2, but may be changed as appropriate. For example, although FIG. 2 illustrates the pixel 12 including the two photoelectric converters PD, the number of photoelectric converters PD included in the pixel 12 is not limited to two. For example, a focal length detection signal (A signal) may be acquired based on signals from N photoelectric converters PD among a plurality of photoelectric converters included in each pixel 12, and an image acquisition signal (A+B signal) may be acquired based on signals from M photoelectric converters PD among the plurality of photoelectric converters. In the above description, N is an integer equal to or larger than one, and M is an integer larger than N and thus equal to larger than two. The M photoelectric converters PD include the N photoelectric converters PD. The M photoelectric converters PD may be part of the plurality of photoelectric converters included in the pixel 12.

In FIG. 1, a plurality of pixels are disposed in the row direction and the column direction, but the present invention is not limited to this configuration. For example, the plurality of pixels may be disposed in a staggered shape or a honeycomb shape.

The imaging systems described in the ninth and tenth embodiments are exemplary imaging systems to which each imaging device according to the present invention is applicable. An imaging system to which each imaging device according to the present invention is applicable is not limited to the configurations illustrated in FIGS. 16 and 17A.

The above-described embodiments are merely exemplary specific configurations for achieving the present invention, and thus the technical scope of the present invention should not be limited by the embodiments. In other words, the present invention may be achieved in various manners without departing from the technological idea or main characteristic thereof.

According to the present invention, it is possible to reduce decrease of the image quality of an imaging device configured to drive to read only an image acquisition signal at a row where a pixel array unit is provided, and read a focal length detection signal and an image acquisition signal at another row.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-182402, filed Sep. 22, 2017, which is hereby incorporated by reference herein in its entirety.

What is claimed is:

1. An imaging device comprising:
    a pixel array unit in which a plurality of pixels each including a plurality of photoelectric converters are two-dimensionally disposed; and
    a signal processing unit including an analog-digital conversion unit configured to convert analog signals output from the plurality of pixels into digital signals, wherein each of a part of the pixels of the plurality of pixels outputs a first analog signal based on electric charge generated at N (N is an integer equal to or larger than one) photoelectric converters among the plurality of photoelectric converters, and a second analog signal based on electric charge generated at M (M is an integer larger than N) photoelectric converters among the plurality of photoelectric converters, the M photoelectric converters including the N photoelectric converters, wherein each of other part of the pixels of the plurality of pixels outputs the second analog signal, wherein the number of the second analog signals output to the signal processing unit is larger than the number of the first analog signals output to the signal processing unit, and wherein the signal processing unit receives the first analog signal and the second analog signal from each of the part of the pixels before the analog-digital conversion unit starts analog-digital conversion of the first analog signal.

2. The imaging device according to claim 1, wherein, in a frame, each of the part of the pixels outputs the first analog signal and the second analog signal, and each of the other part of the pixels outputs the second analog signal.

3. The imaging device according to claim 1,
wherein the signal processing unit includes an analog signal holding unit,
wherein the first analog signal output from each of the part of the pixels is held by the analog signal holding unit, and
wherein the signal processing unit receives the second analog signal before the analog-digital conversion unit receives the first analog signal held by the analog signal holding unit.

4. The imaging device according to claim 1,
wherein the plurality of pixels are disposed at a plurality of rows and a plurality of columns,
wherein each of a plurality of pixels disposed at a first row outputs the first analog signal and the second analog signal, and
wherein each of a plurality of pixels disposed at a second row different from the first row outputs the second analog signal and does not output the first analog signal.

5. The imaging device according to claim 4,
wherein each of the plurality of pixels further includes an electric charge holding unit to which electric charge held by the plurality of photoelectric converters is transferred, and an amplifier unit configured to output an analog signal in accordance with a voltage at the electric charge holding unit, and
wherein a length of a period until transferring of the electric charge to be the second analog signal to the electric charge holding unit ends after the electric charge holding unit is reset is same between the pixel disposed at the first row and the pixel disposed at the second row.

6. The imaging device according to claim 4,
wherein the analog-digital conversion unit includes a plurality of analog-digital conversion circuits disposed in a row direction, and
wherein each of the analog-digital conversion circuits performs analog-digital conversion of an analog signal from pixel disposed at each column.

7. The imaging device according to claim 3,
wherein the analog signal holding unit includes a plurality of signal holding circuits, and
wherein each of the plurality of signal holding circuits includes
an input node,
a signal holding unit connected with the input node via a first switch,
a first amplifier including an input terminal connected with a node between the first switch and the signal holding unit,
an output node connected with an output terminal of the first amplifier via a second switch, and
a second amplifier including an input terminal connected with the input node, and an output terminal connected with the output node via a third switch.

8. The imaging device according to claim 7,
wherein each of the plurality of signal holding circuits further includes
a fourth switch provided between the input node and the first switch, and
a second signal holding unit connected with a node between the first switch and the fourth switch.

9. The imaging device according to claim 3,
wherein the analog signal holding unit further includes a second signal holding unit configured to hold an analog signal output from the pixel, and
wherein the analog signal holding unit is configured to hold the second analog signal by the second signal holding unit before outputting the first analog signal held by the first signal holding unit to the analog-digital conversion unit.

10. The imaging device according to claim 9,
wherein the analog signal holding unit includes a plurality of signal holding circuits,
wherein each of the plurality of signal holding circuits includes
an input node,
a signal holding unit having one terminal connected with the input node via a first switch,
a first amplifier connected with the other terminal of the signal holding unit,
an output node connected with an output terminal of the first amplifier via a second switch,
the second signal holding unit having one terminal connected with the input node via a third switch,
a second amplifier connected with the other terminal of the second signal holding unit, and
a fourth switch connected with an output terminal of the second amplifier and connected with the output node.

11. The imaging device according to claim 10,
wherein each of the plurality of signal holding circuits further includes
a fifth switch configured to control a connection state between the other terminal of the signal holding unit and the output terminal of the first amplifier,
a sixth switch configured to control a connection state between the one terminal of the signal holding unit and the output terminal of the first amplifier,
a seventh switch configured to control a connection state between the other terminal of the second signal holding unit and the output terminal of the second amplifier, and
an eighth switch configured to control a connection state between the one terminal of the second signal holding unit and the output terminal of the second amplifier.

12. The imaging device according to claim 11, further comprising a control unit configured to control the fifth switch and the sixth switch,
   wherein the control unit is configured to remove an offset of the first amplifier by controlling the fifth switch to turn off and the sixth switch to turn on, and then controlling the fifth switch to turn on and the sixth switch to turn off.

13. The imaging device according to claim 12, wherein the control unit is configured to remove an offset of the second amplifier by controlling the seventh switch to turn off and the eighth switch to turn on, and then controlling the seventh switch to turn on and the eighth switch to turn off.

14. The imaging device according to claim 1,
   wherein the first analog signal is a signal for focal length detection, and
   wherein the second analog signal is a signal for image acquisition.

15. A method of driving an imaging device including a pixel array unit in which a plurality of pixels each including a first photoelectric converter, a second photoelectric converter, a first transfer transistor connected with the first photoelectric converter, and a second transfer transistor connected with the second photoelectric converter are two-dimensionally disposed, the method comprising:
   outputting a first analog signal of each of a part of pixels of the plurality of pixels by turning on the first transfer transistor at each of the part of the pixels of the plurality of pixels;
   outputting a second analog signal of each of the part of the pixels by turning on the first transfer transistor and the second transfer transistor at each of the part of the pixels after the outputting the first analog signal;
   performing analog-digital conversion of the first analog signal;
   performing analog-digital conversion of the second analog signal; and
   outputting the second analog signal of each of the other part of pixels of the plurality of pixels by turning on the first transfer transistor and the second transfer transistor at each of the other part of pixels of the plurality of pixels to output the second analog signal,
   wherein the number of the second analog signals output from the pixel array unit is larger than the number of the first analog signals output from the pixel array unit, and
   wherein the outputting the second analog signal of each of the part of the pixels is performed before the performing analog-digital conversion of the first analog signal step starts.

16. The method of driving the imaging device according to claim 15, wherein the outputting the second analog signal of each of the part of the pixels ends before the performing analog-digital conversion of the first analog signal step starts.

17. The method of driving the imaging device according to claim 16,
   wherein the plurality of pixels are disposed at a plurality of rows and a plurality of columns,
   wherein in a first frame,
      each of a plurality of pixels disposed at a first row outputs the first analog signal and the second analog signal,
      each of a plurality of pixels disposed at a second row outputs the second analog signal and do not output the first analog signal, and
   wherein in a second frame different from the first frame,
      each of a plurality of pixels disposed at the first row outputs the second analog signal and do not output the first analog signal, and
      each of a plurality of pixels disposed at the second row outputs the first analog signal and the second analog signal.

18. The method of driving the imaging device according to claim 17,
   wherein each of the plurality of pixels further includes an electric charge holding unit to which electric charge held by each of the first photoelectric converter and the second photoelectric converter is transferred, and
   wherein a length of a period until transferring of the electric charge to be the second analog signal to the electric charge holding unit ends after the electric charge holding unit is reset is same between the pixels disposed at the first row and the pixels disposed at the second row.

19. An imaging system comprising:
   the imaging device according to claim 1; and
   a signal processing unit configured to process a signal output from the imaging device.

20. A movable object comprising:
   the imaging device according to claim 1;
   a distance information acquisition unit configured to acquire information of distance to an object from a parallax image based on a signal output from each pixel of the imaging device; and
   a control unit configured to control the movable object based on the distance information.

* * * * *